United States Patent
Mori et al.

(10) Patent No.: US 10,026,612 B2
(45) Date of Patent: Jul. 17, 2018

(54) METHOD FOR PRODUCING GROUP III NITRIDE CRYSTAL, GROUP III NITRIDE CRYSTAL, SEMICONDUCTOR DEVICE AND APPARATUS FOR PRODUCING GROUP III NITRIDE CRYSTAL

(71) Applicants: OSAKA UNIVERSITY, Suita-shi, Osaka (JP); ITOCHU PLASTICS INC., Tokyo (JP)

(72) Inventors: Yusuke Mori, Osaka (JP); Mamoru Imade, Osaka (JP); Masashi Yoshimura, Osaka (JP); Masashi Isemura, Tokyo (JP)

(73) Assignees: Osaka University, Osaka (JP); Itochu Plastics Inc., Tokyo (JP)

( * ) Notice: Subject to any disclaimer, the term of this patent is extended or adjusted under 35 U.S.C. 154(b) by 49 days.

(21) Appl. No.: 15/028,341

(22) PCT Filed: Oct. 8, 2014

(86) PCT No.: PCT/JP2014/076998
§ 371 (c)(1),
(2) Date: Apr. 8, 2016

(87) PCT Pub. No.: WO2015/053341
PCT Pub. Date: Apr. 16, 2015

(65) Prior Publication Data
US 2016/0268129 A1  Sep. 15, 2016

(30) Foreign Application Priority Data
Oct. 9, 2013 (JP) ................................ 2013-212197

(51) Int. Cl.
C30B 25/02    (2006.01)
H01L 21/02    (2006.01)
(Continued)

(52) U.S. Cl.
CPC ........ *H01L 21/02645* (2013.01); *C23C 16/22* (2013.01); *C23C 16/303* (2013.01);
(Continued)

(58) Field of Classification Search
CPC .......... C30B 25/02; C30B 25/04; C30B 29/52
See application file for complete search history.

(56) References Cited

U.S. PATENT DOCUMENTS

2009/0126623 A1    5/2009    Yamazaki

FOREIGN PATENT DOCUMENTS

JP    52-023600    2/1977
JP    2006-089811    4/2006
(Continued)

OTHER PUBLICATIONS

International Search Report issued in International Application No. PCT/JP2014/076998, dated Nov. 11, 2014, 2 pages.
(Continued)

*Primary Examiner* — Robert M Kunemund
(74) *Attorney, Agent, or Firm* — Hamre, Schumann, Mueller & Larson, P.C.

(57) ABSTRACT

The present invention is intended to provide a method of producing a Group III nitride crystal that prevents a halogen-containing by-product from adversely affecting crystal generation and is superior in reactivity and operability. A method of producing a Group III nitride crystal includes a step of causing a Group III metal to react with an oxidizing gas and nitrogen-containing gas, thereby producing a Group III nitride crystal.

29 Claims, 11 Drawing Sheets

(51) Int. Cl.
*C30B 25/14* (2006.01)
*C23C 16/30* (2006.01)
*C23C 16/448* (2006.01)
*C30B 25/00* (2006.01)
*C30B 29/40* (2006.01)
*C23C 16/22* (2006.01)
*H01L 29/20* (2006.01)
*H01L 29/32* (2006.01)

(52) U.S. Cl.
CPC .......... *C23C 16/4488* (2013.01); *C30B 25/00* (2013.01); *C30B 25/02* (2013.01); *C30B 25/14* (2013.01); *C30B 29/403* (2013.01); *H01L 21/0237* (2013.01); *H01L 21/0254* (2013.01); *H01L 21/0262* (2013.01); *H01L 21/02576* (2013.01); *H01L 21/02639* (2013.01); *H01L 29/2003* (2013.01); *H01L 29/32* (2013.01)

(56) References Cited

FOREIGN PATENT DOCUMENTS

| JP | 2008-024544 | * | 2/2008 |
| JP | 2009-234800 | | 10/2009 |

OTHER PUBLICATIONS

Extended European Search Report issued in corresponding European patent application No. 14852380.6, dated May 12, 2017, 7 pages.

* cited by examiner

★Growth condition

H$_2$O supply amount: 60sccm, Growing part temperature: 1200°C,
Time for growth: 1 hour, Amount of Ga: 3g, H$_2$O carrier nitrogen: 1000sccm,
NH$_3$/N$_2$: 500/1500sccm, Seed substrate: c-GaN/Sapp.

| Souce temperature | 1000°C | 1100°C | 1200°C |
|---|---|---|---|
| Ga$_2$O supply amount | 0.247 g/h | 0.378 g/h | 0.977 g/h |
| By-product Ga$_2$O$_3$ generation amount | 1.99 g/h | 2.82 g/h | 1.91 g/h |
| Photography of boat after growth | | | |
| SEM image | | | |
| Growth rate | 3 μm/h | 8 μm/h | 23 μm/h |

| H₂ flow rate (sccm) | 0 | 100 |
|---|---|---|
| Photography of source boat after growth | | |
| Ga₂O₃ (g) | 0.0188 | 0 |
| Ga₂O (g/h) | 0.5757 | 0.5498 |

H₂O: 10 sccm, N₂ 1400 sccm
Source temperature: 1150°C

H₂O: 10 sccm, N₂ 1400 sccm
H₂: 100 sccm

| T_Source (°C) | 1000 | 1100 | 1150 |
|---|---|---|---|
| Photography of source boat | | | |
| Ga₂O₃ (g) | - | 0.0006 | 0 |
| Ga₂O (g/h) | | 0.1629 | 0.5498 |

FIG. 11

H₂: 100 sccm, N₂ 1400 sccm
Source temperature: 1150°C

| H₂O (sccm) | 4 | 5 | 10 |
|---|---|---|---|
| Photography of source boat | | | |
| Ga₂O₃ (g) | 0 | 0 | 0 |
| Ga₂O (g/h) | 0.1723 | 0.2883 | 0.5498 |

FIG. 12

| Partial pressure of $Ga_2O$ | 42 | 147 | 230 |
|---|---|---|---|
| SEM image (bird's-eye image) | | | |
| Growth rate (μm/h) | 26 | 74 | 104 |
| FWHM of XRC(arcsec) | 104 | 115 | 108 |

FIG. 18

METHOD FOR PRODUCING GROUP III NITRIDE CRYSTAL, GROUP III NITRIDE CRYSTAL, SEMICONDUCTOR DEVICE AND APPARATUS FOR PRODUCING GROUP III NITRIDE CRYSTAL

TECHNICAL FIELD

The present invention relates to a method of producing a Group III nitride crystal, a Group III nitride crystal, a semiconductor apparatus, and an apparatus for producing a Group III nitride crystal.

BACKGROUND ART

Group III nitride crystals are used, for example, in the fields of photoelectric devices such as semiconductor lasers, light-emitting diodes, sensors, and the like; heterojunction high-speed electronic devices; and the like. As a method of producing a Group III nitride crystal, the halide vapor phase epitaxy (HVPE method, for example, see Patent Document 1) and the like are in practical use.

However, the HVPE method has a problem of a by-product (e.g., $NH_4Cl$) generated in crystal generation adversely affecting the crystal generation by blocking an exhaust tube of a production apparatus or the like. For solving this problem, a method of producing a Group III nitride crystal in which Group III oxide is caused to react with reducing gas to generate Group III oxide reduced product gas and then the Group III oxide reduced product gas is caused to react with nitrogen-containing gas to generate a Group III nitride crystal has been proposed (see Patent Document 2). In this method, a halogen-containing by-product does not adversely affect crystal generation because the method can be performed without using halide.

CITATION LIST

Patent Document(s)

Patent Document 1: JP S52(1977)-23600 A
Patent Document 2: JP 2009-234800 A

BRIEF SUMMARY OF THE INVENTION

Problem to be Solved by the Invention

However, the method disclosed in Patent Document 2 has a problem in reactivity and operability because it requires use of a Group III oxide (e.g., $Ga_2O_3$). In this regard, further improvement is desired.

Hence, the present invention is intended to provide a method of producing a Group III nitride crystal that prevents a halogen-containing by-product from adversely affecting crystal generation and is superior in reactivity and operability, a Group III nitride crystal, a semiconductor apparatus, and an apparatus for producing a Group III nitride crystal.

Means for Solving Problem

In order to achieve the above object, the present invention provides a method of producing a Group III nitride crystal, the method including a step of causing a Group III metal to react with an oxidizing agent and nitrogen-containing gas, thereby producing a Group III nitride crystal.

The present invention also provides a Group III nitride crystal produced by the method according to the present invention.

The present invention also provides a semiconductor apparatus, including: the Group III nitride crystal according to the present invention, wherein the Group III nitride crystal is a semiconductor.

The present invention also provides an apparatus for producing a Group III nitride crystal used in the method according to the present invention, the apparatus including: a reaction vessel; a Group III metal supply unit; an oxidizing agent supply unit; and a nitrogen-containing gas supply unit, wherein the Group III metal supply unit is configured to continuously supply the Group III metal into the reaction vessel, the oxidizing agent supply unit is configured to continuously supply the oxidizing agent into the reaction vessel, the nitrogen-containing gas supply unit is configured to continuously supply the nitrogen-containing gas into the reaction vessel, and the Group III metal is caused to react with the oxidizing agent and the nitrogen-containing gas in the reaction vessel to produce the Group III nitride crystal.

Effects of the Invention

According to the present invention, it is possible to provide a method of producing a Group III nitride crystal that prevents a halogen-containing by-product from adversely affecting crystal generation and is superior in reactivity and operability, a Group III nitride crystal, a semiconductor apparatus, and an apparatus for producing a Group III nitride crystal.

BRIEF DESCRIPTION OF DRAWINGS

FIG. 6A is a perspective view and FIG. 6B is a cross sectional view.

FIG. 11 shows photographs, each showing the state of a Group III metal container after production of Group III nitride crystal in still another Example.

FIG. 12 shows photographs, each showing the state of a Group III metal container after production of Group III nitride crystal in still another Example.

FIG. 15A is a cross sectional view and FIG. 15B is a perspective view.

FIG. 18 shows photographs of GaN crystals produced (grown) in still another Example.

MODE FOR CARRYING OUT THE INVENTION

Figure 1:
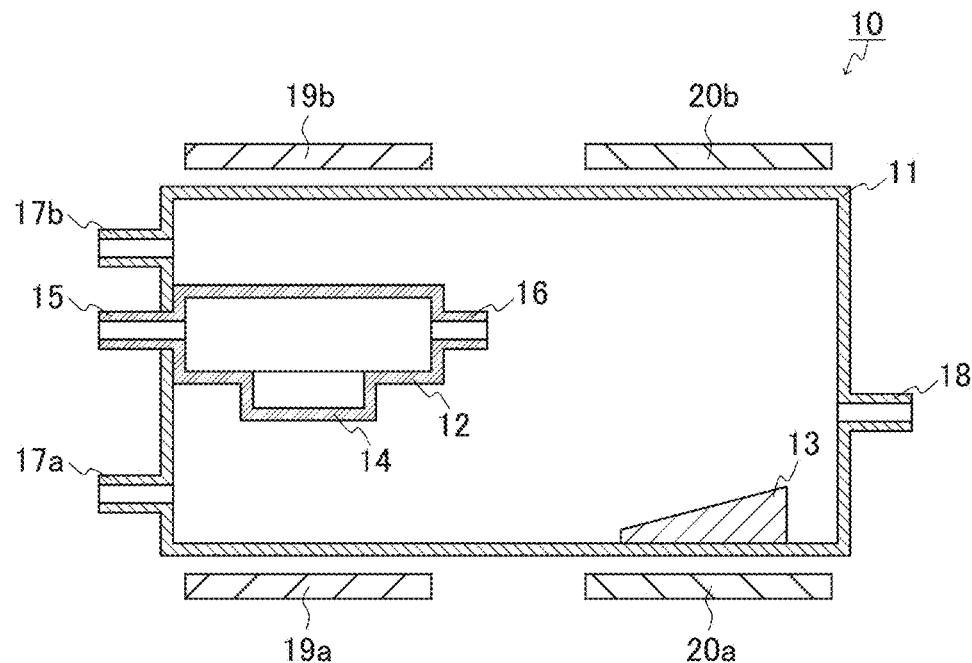
FIG. 1 is s cross sectional view schematically showing an example of the apparatus used in the method of producing a Group III nitride crystal according to the present invention.

The present invention is described below with reference to examples. The present invention, however, is not limited by the following description.

In the method of producing a Group III nitride crystal according to the present invention (hereinafter, also simply referred to as the "production method of the present invention"), the Group III metal is, for example, at least one selected from the group consisting of gallium, indium, and aluminum. Particularly preferably, the Group III metal is gallium (Ga).

In the production method of the present invention, preferably, the step of producing a Group III nitride crystal includes steps of: causing the Group III metal to react with the oxidizing agent, thereby generating Group III metal oxidation product gas; and causing the Group III metal oxidation product gas to react with the nitrogen-containing gas, thereby generating the Group III nitride crystal. In the step of generating Group III metal oxidation product gas, preferably, the Group III metal is caused to react with the oxidizing agent in a heated state. Furthermore, preferably, the Group III metal oxidation product gas is Group III metal oxide gas.

In the production method of the present invention, more preferably, the Group III metal is gallium and the Group III metal oxide gas is $Ga_2O$ gas.

In the production method of the present invention, preferably, the oxidizing agent is an oxygen-containing compound. Furthermore, in the production method of the present invention, preferably, the oxidizing agent is oxidizing gas.

In the production method of the present invention, the oxidizing gas is preferably at least one selected from the group consisting of $H_2O$ gas, $O_2$ gas, $CO_2$ gas, and CO gas and is particularly preferably $H_2O$ gas.

In the production method of the present invention, preferably, the nitrogen-containing gas is at least one selected from the group consisting of $N_2$, $NH_3$, hydrazine gas, and alkylamine gas.

In the production method of the present invention, there is no particular limitation on the volume of the oxidizing gas. The volume of the oxidizing gas with respect to the total volume of the oxidizing gas and the nitrogen-containing gas is, for example, more than 0% and less than 100%, preferably 0.001% or more and less than 100%, more preferably in the range from 0.01% to 95%, still more preferably in the range from 0.1% to 80%, and still more preferably in the range from 0.1% to 60%. In the present invention, when the present invention is specified by the numerical limitation, the numerical limitation may strictly be the numerical value or may roughly be the numerical value. For example, when the numerical limitation is "0.001% or more", it may strictly be 0.001% or more or may roughly be 0.001% or more. Furthermore, for example, when the numerical limitation is "in the range from 0.1% to 80%", it may strictly be in the range from 0.1% to 80% or may roughly be in the range from 0.1% to 80%.

In the step of producing a Group III nitride crystal in the production method of the present invention, preferably, a reaction is performed in the presence of reducing gas in a reaction system. Preferably, the reducing gas is hydrogen-containing gas. Furthermore, more preferably, the reducing gas is at least one selected from the group consisting of $H_2$ gas, carbon monoxide (CO) gas, hydrocarbon gas, $H_2S$ gas, $SO_2$ gas, and $NH_3$ gas. Still more preferably, the hydrocarbon gas is at least one of methane gas and ethane gas. Furthermore, in the production method of the present invention, still more preferably, the oxidizing agent is the oxidizing gas and the oxidizing gas is mixed with the reducing gas. Moreover, in the production method of the present invention, still more preferably, the nitrogen-containing gas is mixed with the reducing gas.

In the production method of the present invention, preferably, the reaction in the presence of the reducing gas is performed at a temperature of 650° C. or higher.

In the production method of the present invention, the Group III nitride crystal may be generated on a substrate. The substrate may include an underlayer and a seed crystal disposed on the underlayer.

In the production method of the present invention, the Group III nitride crystal may be generated in a condition under pressure, in a condition under reduced pressure, or in conditions other than these conditions.

In the step of producing a Group III nitride crystal, the growth rate of the Group III nitride crystal is not particularly limited, and is, for example, 4 μm/h or more, 10 μm/h, 20 μm/h, 30 μm/h, 40 μm/h, 50 μm/h, 60 μm/h, 70 μm/h, 80 μm/h, 90 μm/h, or 100 μm/h or more. The faster the growth rate of the Group III nitride crystal, the better. The upper limit of the growth rate is not particularly limited, and is, for example, 2000 μm/h or less. The growth rate of the Group III nitride crystal is represented by the rate of increase of the thickness of the Group III nitride crystal, unless otherwise stated. For example, when the growth rate of the Group III nitride crystal is 10 μm/h, it means that the rate of increase of the thickness of the Group III nitride crystal is 10 μm per hour.

The production method of the present invention may further include a step of: slicing the Group III nitride crystal to provide at least one Group III nitride crystal substrate. Furthermore, the production method of the present invention may further include a step of: again producing a Group III nitride crystal with the Group III nitride crystal substrate obtained in the step of slicing as a seed crystal, where in the step of again producing a Group III nitride crystal, the Group III nitride crystal is generated on the Group III nitride crystal substrate.

In the Group III nitride crystal of the present invention, the concentration of the oxygen contained in the crystal may be $1 \times 10^{20}$ cm$^{-3}$ or less or $1 \times 10^{20}$ cm$^{-3}$ or more. Furthermore, in the Group III nitride crystal of the present invention, preferably, the dislocation density is $1 \times 10^7$ cm$^{-2}$ or less. Moreover, in the Group III nitride crystal of the present invention, preferably, the half width of each of a symmetric reflection component (002) and an asymmetric reflection component (102) by XRC (X-ray rocking curve method) is 300 seconds or less.

Next, the specific embodiments of the present invention are described in details with reference to examples.

[1. Production Method of Group III Nitride Crystal of the Present Invention]

As described above, the method of producing a Group III nitride crystal according to the present invention is characterized in that it includes a step of causing a Group III metal to react with an oxidizing agent and nitrogen-containing gas, thereby producing a Group III nitride crystal.

The method of producing a Group III nitride crystal disclosed in Patent Document 2 requires use of a Group III oxide (e.g., $Ga_2O_3$) as a material as described above. However, Group III oxide such as $Ga_2O_3$ assumes in a flowing state (i.e., liquid or gas) only under a very limited condition. Thus, $Ga_2O_3$ has a problem in reactivity and operability. For example, because the melting point of $Ga_2O_3$ is 1725° C., which is very high, $Ga_2O_3$ becomes liquid only at a temperature higher than the very high melting point. Furthermore, $Ga_2O_3$ tends not to become gas if it is not under a reducing condition.

Hence, the inventors of the present invention have conducted earnest studies and arrived at the idea of using a Group III metal instead of Group III oxide as a material. Because of its low melting point, a Group III metal easily becomes liquid by heating. Thus, the Group III metal is superior in reactivity and operability. As to the operability, specifically, when the Group III metal is liquid, it is easily supplied into a reaction vessel continuously, whereby the Group III metal can be easily applied to mass production of Group III nitride crystals, for example. In particular, gallium (Ga) is more superior in operability because its melting point is about 30° C. and becomes liquid even at room temperature.

Furthermore, because the present invention does not need to use halide (e.g., GaCl) as a material as in Patent Document 2, the generation of a halogen-containing by-product can be inhibited. Thus, according to the production method of the present invention, an adverse effect of a by-product on crystal generation can be inhibited. As a result, for example, a Group III nitride crystal can be grown for a long period, and thereby a large, thick Group III nitride crystal can be obtained. Furthermore, according to the production method of the present invention, for example, as is described below, a Group III nitride crystal can be obtained by the epitaxial growth on a substrate and the coloring of the thus obtained Group III nitride crystal can be inhibited.

As described above, preferably, the step of producing a Group III nitride crystal in the production method of the present invention includes steps of; causing the Group III metal to react with the oxidizing agent, thereby generating Group III metal oxidation product gas; and causing the Group III metal oxidation product gas to react with the nitrogen-containing gas, thereby generating the Group III nitride crystal. This allows a Group III nitride crystal to be obtained in the Group III nitride crystal generation step without generating a solid by-product, for example. When a solid by-product is not generated in the Group III nitride crystal generation step, for example, a filter or the like for removing a by-product is not required. Thus, it is superior in terms of cost. Also in the Group III metal oxidation product gas generation step, for example, the generation of a by-product (e.g., solid by-product) is further inhibited by performing a reaction in the presence of reducing gas.

Specifically, the production method of the present invention can be performed as follows, for example.

[1-1. Production Apparatus of Group III Nitride Crystal]

FIG. 1 shows an example of the configuration of the production apparatus used in the production method of the present invention. In FIG. 1, in order to make it clearly understandable, the size, the ratio, and the like of components are different from actual ones. As shown in FIG. 1, the production apparatus 10 of the present example includes first container 11, second container 12, and substrate support portion 13, and the second container 12 and the substrate support portion 13 are disposed in the first container 11. The second container 12 is fixed at the left side surface of the first container 11 in FIG. 1. The substrate support portion 13 is fixed at the lower surface of the first container 11. The second container 12 includes Group III metal placement portion 14 at its lower surface. The second container 12 is provided with oxidizing gas introduction tube 15 at its left side surface and is provided with Group III metal oxidation product gas delivery tube 16 at its right side surface in FIG. 1. Oxidizing gas can be continuously introduced (supplied) into the second container 12 through the oxidizing gas introduction tube 15. The first container 11 is provided with nitrogen-containing gas introduction tubes 17a and 17b at its left side surface and is provided with exhaust tube 18 at its right side surface in FIG. 1. Nitrogen-containing gas can be continuously introduced (supplied) into the first container 11 through the nitrogen-containing gas introduction tubes 17a and 17b. Furthermore, at the outside of the first container 11, first heating units 19a and 19b and second heating units 20a and 20b are disposed. However, the production apparatus used in the production method of the present invention is not limited to this example. For example, although the number of second containers 12 disposed in the first container 11 in this example is one, the number of second containers 12 disposed in the first container 11 may be more than one. Furthermore, although the number of the oxidizing gas introduction tubes 15 is one in this example, the number of the oxidizing gas introduction tubes 15 may be more than one.

There is no particular limitation on the shape of the first container. Examples of the shape of the first container include a cylinder, a quadratic prism, a triangular prism, and a shape created by combining these shapes. Examples of the material for forming the first container include quartz, alumina, aluminum titanate, mullite, tungsten, and molybdenum. A self-made first container or a commercially available first container may be used. The commercially available first container can be, for example, the "quartz reaction tube" (product name) manufactured by PHOENIX TECHNO.

There is no particular limitation on the shape of the second container. Examples of the shape of the second container include those described for the first container. Examples of the material for forming the second container include tungsten, stainless, molybdenum, aluminum titanate, mullite, and alumina. A self-made second container or a commercially available second container may be used. The commercially available second container can be, for example, the "SUS316BA tube" (product name) manufactured by Mecc Technica Co.

Conventionally known heating units can be used as the first heating unit and the second heating unit. Examples of the heating unit include ceramic heaters, high frequency heaters, resistance heaters, and light collecting heaters. One type of the heating units may be used alone or two or more of them may be used in combination. Preferably, the first heating unit and the second heating unit are each independently controlled.

Figure 3:
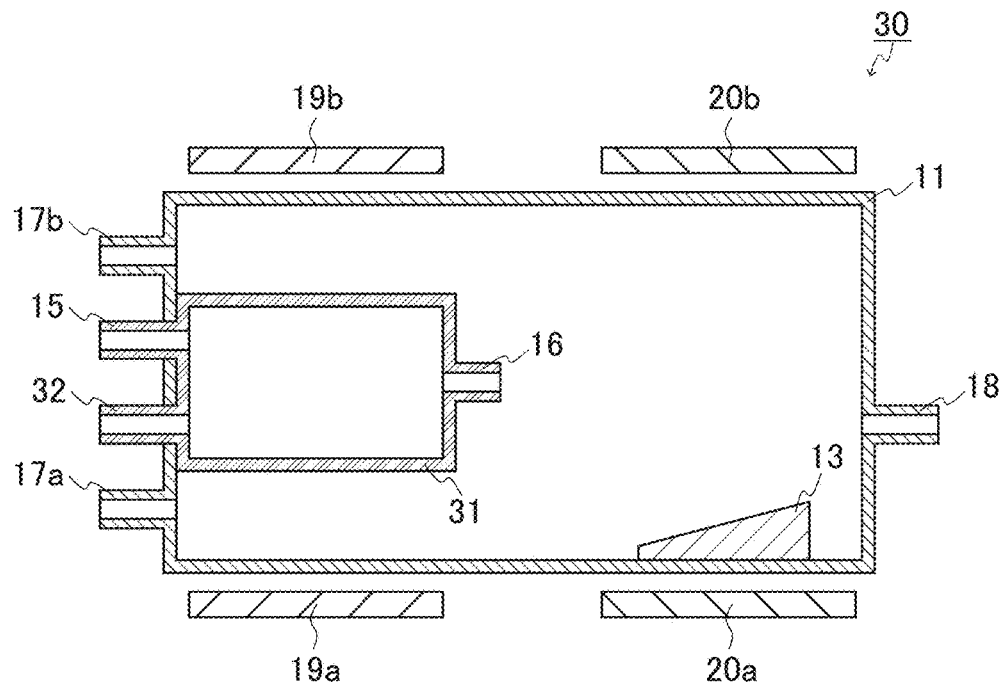
FIG. 3 is a cross sectional view schematically showing another example of the apparatus used in the method of producing a Group III nitride crystal according to the present invention.

FIG. 3 shows another example of the configuration of the production apparatus used in the production method of the present invention. As shown in FIG. 3, this production apparatus 30 has the same configuration as the production apparatus 10 shown in FIG. 1 except that it includes second container 31 instead of second container 12. As shown in FIG. 3, the second container 31 is provided with oxidizing gas introduction tube 15 at the upper part of its left side surface, is provided with Group III metal introduction tube 32 at the lower part of its left side surface, and is provided with Group III metal oxidation product gas delivery tube 16 at its right side surface. Oxidizing gas can be continuously introduced (supplied) into the second container 31 through the oxidizing gas introduction tube 15. Group III metal can be continuously introduced (supplied) into the second container 31 through the Group III metal introduction tube 32. The second container 31 does not include Group III metal placement portion 14, instead, it has a deep depth (vertical width) and allows a Group III metal to be stored in its lower part. The first container 11 and the second container 31 of the production apparatus shown in FIG. 3 correspond to the "reaction vessel" of the production apparatus of a Group III nitride crystal of the present invention. The Group III metal introduction tube 32 of the production apparatus shown in FIG. 3 corresponds to the "Group III metal supply unit" of the production apparatus of a Group III nitride crystal of the present invention. The oxidizing gas introduction tube 15 of the production apparatus shown in FIG. 3 corresponds to the "oxidizing gas supply unit" of the production apparatus of a Group III nitride crystal of the present invention. The nitrogen-containing gas introduction tubes 17a and 17b of the production apparatus shown in FIG. 3 correspond to the "nitrogen-containing gas supply unit" of the production apparatus of a Group III nitride crystal of the present invention.

The configuration of the production apparatus used in the production method of the present invention is not limited to those shown in FIGS. 1 and 3. For example, the heating units 19a, 19b, 20a, and 20b and the substrate support portion 13 can be omitted. However, from the viewpoint of reactivity and operability, the production apparatus is preferably provided with these components. Furthermore, the production apparatus used in the production method of the present invention may be provided with other components in addition to the above-described components. Examples of other components include a unit configured to control the temperatures of the first heating unit and the second heating unit and a unit configured to adjust the pressure and the introduction amount of the gas used in each step.

The production apparatus used in the production method of the present invention can be produced by assembling the above-described components and other components as needed according to a conventionally known method, for example.

[1-2. Production Steps, Reaction Conditions, Etc.]

Next, steps, reaction conditions, materials to be used, and the like in the production method of the present invention are described. However, the present invention is not limited thereto. A mode for carrying out the production method of the present invention using the production apparatus shown in FIG. 1 or the production apparatus shown in FIG. 3 is described below.

Figure 2:
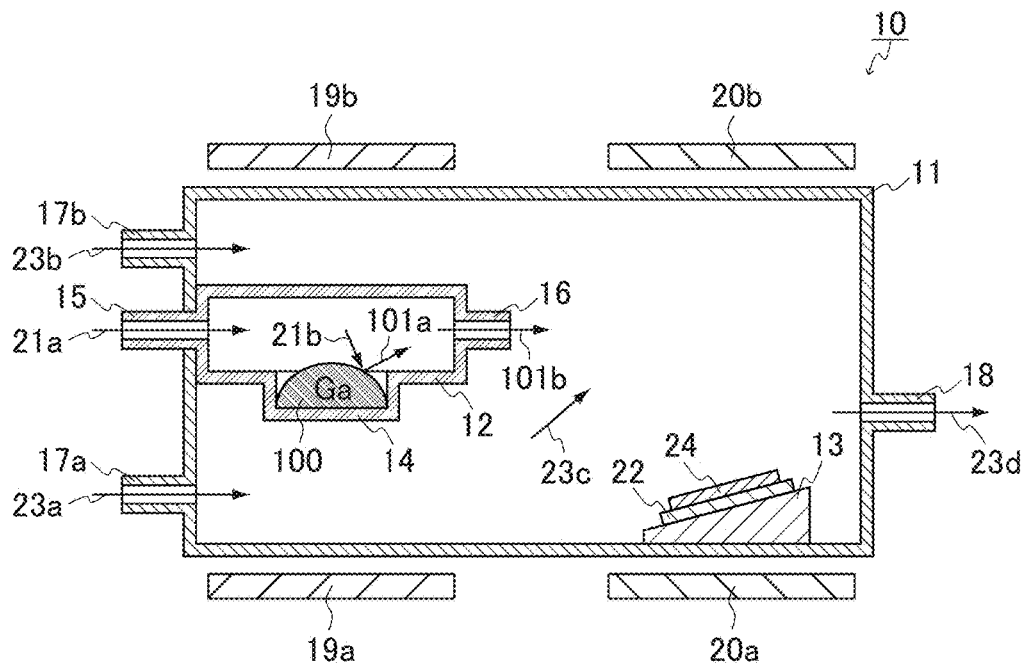
FIG. 2 is a cross sectional view schematically showing an overview of the method of producing a Group III nitride crystal according to the present invention using the apparatus shown in FIG. 1.

First, as shown in FIG. 2 (or FIG. 4), substrate 22 is preliminarily provided on substrate support portion 13. The substrate 22 can be selected appropriately according to the aspect or the like of a Group III nitride crystal to be generated thereon. Examples of the material for the substrate 22 include sapphire, Group III nitride, gallium arsenide (GaAs), silicon (Si), silicon carbide (SiC), magnesium oxide (MgO), zinc oxide (ZnO), gallium phosphide (GaP), zirconium diboride ($ZrB_2$), lithium dioxogallate ($LiGaO_2$), BP, $MoS_2$, $LaAlO_3$, NbN, $MnFe_2O_4$, $ZnFe_2O_4$, ZrN, TiN, $MgAl_2O_4$, $NdGaO_3$, $LiAlO_2$, $ScAlMgO_4$, and $Ca_8La_2(PO_4)_6O_2$. Among them, sapphire is particularly preferable in terms of cost and the like.

Figure 4:
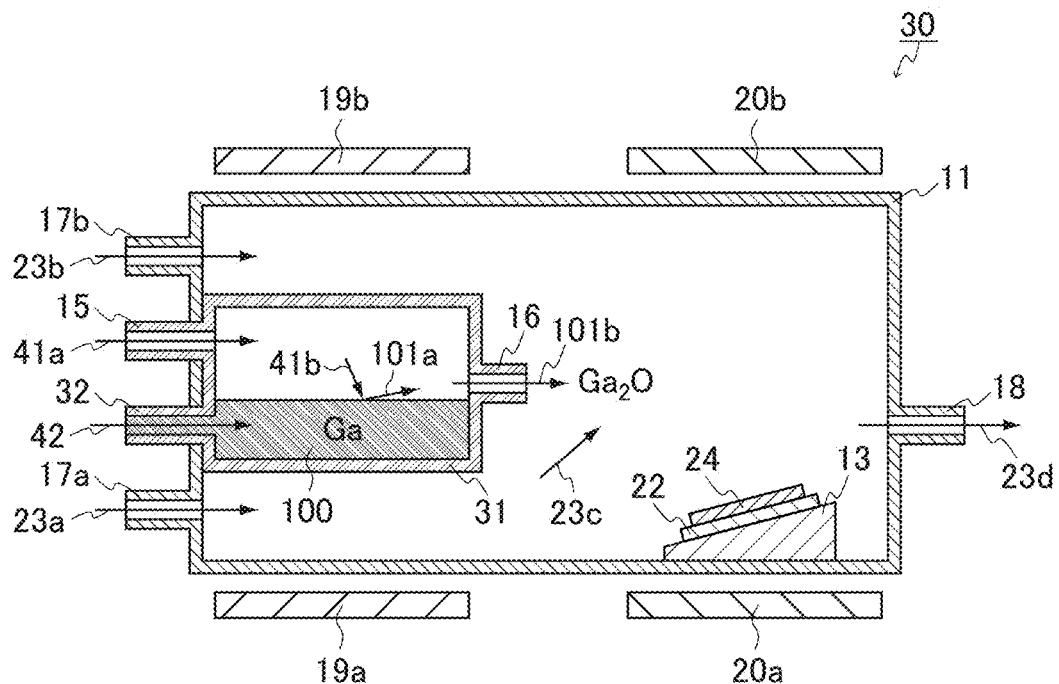
FIG. 4 is a cross sectional view schematically showing an overview of the method of producing a Group III nitride crystal according to the present invention using the apparatus shown in FIG. 3.
Figure 5A:
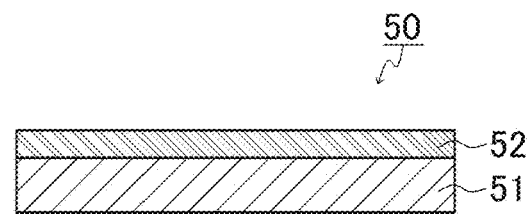
FIG. 5A is a cross sectional view showing an example of the configuration of the substrate.

As described above, the substrate may include an underlayer (substrate body) and a seed crystal disposed thereon. The cross sectional view of FIG. 5A shows an example of the configuration of the substrate including an underlayer and a seed crystal disposed thereon. In FIG. 5A, in order to make it clearly understandable, the size, the ratio, and the like of components are different from actual ones. As shown in FIG. 5A, this substrate 50 includes underlayer 51 and seed crystal 52 disposed thereon. However, the substrate 50 is not limited thereto. Although the seed crystal 52 is in the shape of a layer in this example, the seed crystal can be in the shape of a needle, a feather, or a plate, for example. As the material for the underlayer (substrate body) 51, for example, the materials those described for the substrate 22 can be used. The substrate 22 shown in FIG. 2 and the substrate 22 shown in FIG. 4 may have the same structure as the substrate 50 shown in FIG. 5A.

Figure 5B:
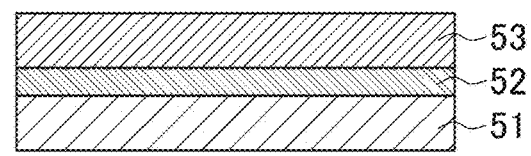
FIG. 5B is a cross sectional view showing an example of the state where a Group III nitride crystal is grown on the substrate shown in FIG. 5A.

The material for the seed crystal may be, for example, the same as or different from the material for the Group III nitride crystal of the present invention to be grown thereon, and is preferably the same as the material for the Group III nitride crystal of the present invention. For example, by forming a crystal on an underlayer using the above-described material for seed crystal, the seed crystal can be disposed on the underlayer. Examples of the method for forming the seed crystal include the metalorganic vapor phase epitaxy (MOVPE method), the molecular beam epitaxy (MBE method), the halide vapor phase epitaxy (HVPE method), and the sodium flux method. The cross sectional view of FIG. 5B shows the state in which Group III nitride crystal 53 is grown on the seed crystal 52.

Next, as shown in FIG. 2, Group III metal 100 is disposed in Group III metal placement portion 14. Alternatively, when the production apparatus shown in FIG. 3 is used, as shown in FIG. 4, Group III metal 42 is introduced into second container 31 from Group III metal introduction tube 32 and is stored in the lower part of the second container 31 as Group III metal 100. The Group III metal 42 can be continuously introduced into the second container 31 from the Group III metal introduction tube 32. For example, the Group III metal 42 can be introduced from the Group III metal introduction tube 32 to refill with a quantity equivalent to the amount of the Group III metal 100 consumed by reaction. Although the Group III metal shown in FIGS. 2 and 4 is Ga (i.e., gallium), Group III metal is not particularly limited thereto. Examples of the Group III metal include aluminum (Al), gallium (Ga), indium (In), and thallium (Tl), and one of them may be used alone or two or more of them may be used in combination. For example, as the Group III metal, at least one selected from the group consisting of aluminum (Al), gallium (Ga), and indium (In) may be used. In this case, the composition of the Group III nitride crystal to be produced can be represented by $Al_sGa_tIn_{\{1-(s+t)\}}N$ (provided that, $0 \leq s \leq 1$, $0 \leq t \leq 1$, $s+t \leq 1$). Furthermore, the Group III metal 100 may be caused to react in the presence of a dopant material or the like, for example. There is no particular limitation on the dopant, and examples thereof include germanium oxide (e.g., $Ge_2O_3$, $Ge_2O$, etc.) and metal germanium.

Furthermore, a ternary or higher nitride crystal produced using two or more kinds of Group III metals can be, for example, a crystal represented by $Ga_xIn_{1-x}N$ ($0<x<1$). For generating a ternary or higher nitride crystal, it is preferable to generate reduced product gas of at least two kinds of Group III oxides. In this case, it is preferable to use a production apparatus provided with at least two second containers.

Because of its relatively low melting point, a Group III metal easily becomes liquid by heating. When the Group III metal is liquid, it can be easily supplied into a reaction vessel (second container 31 in FIG. 4) continuously. Among the above-described Group III metals, gallium (Ga) is particularly preferable. It is because gallium nitride (GaN) produced from gallium is very useful as a material for a semiconductor apparatus. In addition, because gallium can become liquid at room temperature because of its low melting point (about 30° C.), it can be particularly easily supplied to a reaction vessel continuously. When only gallium is used as the Group III metal, a Group III nitride crystal to be produced is gallium nitride (GaN) as described above.

Next, the Group III metal 100 is heated using first heating units 19*a* and 19*b* and the substrate 22 is heated using second heating units 20*a* and 20*b*. In this state, oxidizing gas 21*a* (or 41*a*) is introduced from oxidizing gas introduction tube 15, and nitrogen-containing gas 23*a* and 23*b* is introduced from the nitrogen-containing gas introduction tubes 17*a* and 17*b*. There is no particular limitation on the oxidizing gas 21*a* (or 41*a*). As described above, the oxidizing gas 21*a* (or 41*a*) is preferably at least one selected from the group consisting of $H_2O$ gas, $O_2$ gas, $CO_2$ gas, and CO gas, and is particularly preferably $H_2O$ gas. The oxidizing gas 21*a* (or 41*a*) introduced (supplied) into second container 12 (or 31) comes into contact with the surface of the Group III metal 100 (oxidizing gas 21*b* or 41*b*). The Group III metal 100 is thereby caused to react with the oxidizing gas 21*b* (or 41*b*) to generate Group III metal oxidation product gas 101*a* (Group III metal oxidation product gas generation step). The flow rate of the oxidizing gas is, for example, in the range from 0.0001 to 50 Pa·m³/s, preferably in the range from 0.001 to 10 Pa·m³/s, and more preferably in the range from 0.005 to 1 Pa·m³/s.

In the Group III metal oxidation product gas generation step in the production method of the present invention, from the viewpoint of promoting the generation of the Group III metal oxidation product gas, preferably, the Group III metal is caused to react with the oxidizing gas in a heated state. In this case, the temperature of the Group III oxide is not particularly limited, and is preferably in the range from 650° C. to 1500° C., more preferably in the range from 900° C. to 1300° C., and still more preferably in the range from 1000° C. to 1200° C.

In the Group III metal oxidation product gas generation step, particularly preferably, the Group III metal is gallium, the oxidizing gas is $H_2O$ gas, and the Group III metal oxidation product gas is $Ga_2O$. The reaction formula of this case can be represented, for example, by the following formula (I). However, the reaction formula is not limited thereto.

$$2Ga + H_2O \rightarrow Ga_2O + H_2 \qquad (I)$$

In the production method of the present invention, from the view point of controlling the partial pressure of the oxidizing gas, the Group III metal oxidation product gas generation step may be performed in an atmosphere of mixed gas of the oxidizing gas and inert gas. There are no particular limitations on the proportions of the oxidizing gas and the inert gas with respect to the total amount of the mixed gas. Preferably, the proportion of the oxidizing gas with respect to the total amount of the mixed gas is 0.001 vol. % or more and less than 100 vol. %, and the proportion of the inert gas with respect to the total amount of the mixed gas exceeds 0 vol. % and 99.999 vol. % or less. More preferably, the proportion of the oxidizing gas with respect to the total amount of the mixed gas is 0.01 vol. % or more and 80 vol. % or less, and the proportion of the inert gas with respect to the total amount of the mixed gas is 20 vol. % or more and 99.99 vol. % or less. Still more preferably, the proportion of the oxidizing gas with respect to the total amount of the mixed gas is 0.1 vol. % or more and 60 vol. % or less, and the proportion of the inert gas with respect to the total amount of the mixed gas is 40 vol. % or more and 99.9 vol. % or less. In the production method of the present invention, examples of the inert gas include nitrogen gas, helium gas, argon gas, and krypton gas. Among them, nitrogen gas is particularly preferable. Examples of the method for creating the mixed gas atmosphere include a method of introducing inert gas from an inert gas introduction tube (not shown) provided in the second container separately from the oxidizing gas introduction tube; and a method of preliminarily generating gas in which the hydrogen gas and the inert gas are mixed in predetermined proportions and introducing the thus obtained gas from the oxidizing gas introduction tube. In the case of introducing the inert gas from the separately provided inert gas introduction tube, the flow rate of the inert gas can be set appropriately according to the flow rate of the oxidizing gas and the like. The flow rate of the inert gas is, for example, in the range from 0.1 to 150 Pa·m³/s, preferably in the range from 0.2 to 30 Pa·m³/s, and more preferably from 0.3 to 10 Pa·m³/s.

The generated Group III metal oxidation product gas 101*a* is delivered to the outside of the second container 12 (or 31) through Group III metal oxidation product gas delivery tube 16 (Group III metal oxidation product gas 101*b*). Although the Group III metal oxidation product gas 101*b* shown in FIG. 4 is $Ga_2O$, the Group III metal oxidation product gas 101*b* is not particularly limited thereto. For delivering the Group III metal oxidation product gas 101*b* to the outside of the second container 12 (or 31) through the Group III metal oxidation product gas delivery tube 16, first carrier gas may be introduced. As the first carrier gas, for example, the examples described for the inert gas can be used. The flow rate of the first carrier gas can be the same as that of the inert gas. In the case of introducing the inert gas, the inert gas can be used as the first carrier gas.

The generation of the Group III metal oxidation product gas 101a (101b) may be performed in a condition under pressure, in a condition under reduced pressure, or in conditions other than these conditions, for example. The pressure in the condition under pressure is not particularly limited, and is preferably in the range from $1.0 \times 10^5$ to $1.50 \times 10^7$ Pa, more preferably in the range from $1.05 \times 10^5$ to $5.00 \times 10^6$ Pa, and more preferably in the range from $1.10 \times 10^5$ to $9.90 \times 10^5$ Pa. The method of applying pressure can be, for example, a method of applying pressure by the oxidizing gas, the first carrier gas, or the like. The pressure in the condition under reduced pressure is not particularly limited, and is preferably in the range from $1 \times 10^1$ to $1 \times 10^5$ Pa, more preferably in the range from $1 \times 10^2$ to $9 \times 10^4$ Pa, and still more preferably in the range from $5 \times 10^3$ to $7 \times 10^4$ Pa.

The Group III metal oxidation product gas (e.g., $Ga_2O$ gas) 101b delivered to the outside of the second container 12 (or 31) through the Group III metal oxidation product gas delivery tube 16 is caused to react with nitrogen-containing gas 23c introduced into the first container 11, and Group III nitride (e.g., GaN) crystal 24 is generated on the substrate 22 (Group III nitride crystal generation step). The reaction formula of this case can be represented, for example, by the following formula (II) in the case where the Group III metal oxidation product gas is $Ga_2O$ gas and the nitrogen-containing gas is ammonia gas. However, the reaction formula is not limited thereto. Note that excess remaining gas after reaction can be emitted from exhaust tube 18 as exhaust gas 23d.

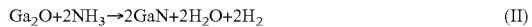

$$Ga_2O + 2NH_3 \rightarrow 2GaN + 2H_2O + 2H_2 \quad \text{(II)}$$

In the production method of the present invention, examples of the nitrogen-containing gas include nitrogen gas ($N_2$), ammonia gas ($NH_3$), hydrazine gas ($NH_2NH_2$), and alkylamine gas. Preferably, the nitrogen-containing gas is at least one of $N_2$ and $NH_3$.

In the Group III nitride crystal generation step, the temperature of the substrate is not particularly limited. From the viewpoint of ensuring the generation rate of crystal and improving crystallinity, the temperature is preferably in the range from 700° C. to 1500° C., more preferably in the range from 1000° C. to 1400° C., and still more preferably in the range from 1100° C. to 1350° C.

The Group III nitride crystal generation step may be performed in a condition under pressure, in a condition under reduced pressure, or in conditions other than these conditions. The pressure in the condition under pressure is not particularly limited, and is preferably in the range from $1.01 \times 10^5$ to $1.50 \times 10^7$ Pa, more preferably in the range from $1.05 \times 10^5$ to $5.00 \times 10^6$ Pa, and more preferably in the range from $1.10 \times 10^5$ to $9.90 \times 10^5$ Pa. The pressure in the condition under reduced pressure is not particularly limited, and is preferably in the range from $1 \times 10^1$ to $1 \times 10^5$ Pa, more preferably in the range from $1 \times 10^2$ to $9 \times 10^4$ Pa, and still more preferably in the range from $5 \times 10^3$ to $7 \times 10^4$ Pa.

In the Group III nitride crystal generation step, the supply amount of the Group III metal oxidation product gas (e.g., $Ga_2O$ gas indicated by 101b in FIGS. 2 and 4) is, for example, in the range from $5 \times 10^{-5}$ to $5 \times 10^1$ mol/h, preferably in the range from $1 \times 10^{-4}$ to 5 mol/h, and more preferably in the range from $2 \times 10^{-4}$ to $5 \times 10^{-1}$ mol/h. The supply amount of the Group III metal oxidation product gas can be adjusted, for example, by adjusting the flow rate of the first carrier gas in generating Group III metal oxidation product gas.

The flow rate of the nitrogen-containing gas can be set appropriately according to the conditions such as the temperature of the substrate and the like. The flow rate of the nitrogen-containing gas is, for example, in the range from 0.1 to 150 Pa·m³/s, preferably in the range from 0.3 to 60 Pa·m³/s, and more preferably in the range from 0.5 to 30 Pa·m³/s.

For transferring the introduced nitrogen-containing gas to a crystal generation region (in the vicinity of the substrate support portion 13 in the first container 11 in FIGS. 1 to 4), second carrier gas may be introduced. For example, the second carrier gas may be introduced from a carrier gas introduction tube (not shown) provided separately from the nitrogen-containing gas introduction tube or introduced from the nitrogen-containing gas introduction tube after being mixed with the nitrogen-containing gas. As the second carrier gas, for example, the examples described for the first carrier gas can be used.

In the case of introducing the second carrier gas from the carrier gas introduction tube, the flow rate of the second carrier gas can be set appropriately according to the flow rate of the nitrogen-containing gas and the like. The flow rate of the second carrier gas is, for example, in the range from 0.1 to 150 Pa·m³/s, preferably in the range from 0.8 to 60 Pa·m³/s, and more preferably in the range from 1.5 to 30 Pa·m³/s.

The mixing ratio A:B (volume ratio) between the nitrogen-containing gas (A) and the second carrier gas (B) is not particularly limited, and is preferably in the range from 2 to 80:98 to 20, more preferably in the range from 5 to 60:95 to 40, and more preferably in the range from 10 to 40:90 to 60. The mixing ratio A:B (volume ratio) can be set, for example, by preliminarily mixing the nitrogen-containing gas and the second carrier gas at a predetermined mixing ratio or adjusting the flow rate of the nitrogen-containing gas and the flow rate of the second carrier gas.

Preferably, the Group III nitride crystal (e.g., GaN crystal) generation step is performed in a condition under pressure. The pressure in the condition under pressure is as described above. The method of applying pressure can be, for example, a method of applying pressure by the nitrogen-containing gas, the second carrier gas, or the like.

The Group III nitride crystal generation step may be performed in a dopant-containing gas atmosphere. This allows a dopant-containing GaN crystal to be generated. Examples of the dopant include Si, S, Se, Te, Ge, Fe, Mg, and Zn. One type of the dopants may be used alone or two or more of them may be used in combination. Examples of the dopant-containing gas include monosilane ($SiH_4$), disilane ($Si_2H_6$), triethylsilane ($SiH(C_2H_5)_3$), tetraethylsilane $Si(C_2H_5)_4$), $H_2S$, $H_2Se$, $H_2Te$, $GeH_4$, $Ge_2O$, $SiO$, $MgO$, and $ZnO$, and one of them may be used alone or two or more of them may be used in combination.

For example, the dopant-containing gas may be introduced from a dopant-containing gas introduction tube (not shown) provided separately from the nitrogen-containing gas introduction tube or introduced from the nitrogen-containing gas introduction tube after being mixed with the nitrogen-containing gas. In the case of introducing the second carrier gas, the dopant-containing gas may be introduced after being mixed with the second carrier gas.

The concentration of the dopant in the dopant-containing gas is not particularly limited, and is, for example, in the range from 0.001 to 100000 ppm, preferably in the range from 0.01 to 1000 ppm, and more preferably in the range from 0.1 to 10 ppm.

There is no particular limitation on the generation rate of the Group III nitride crystal (e.g., GaN crystal). The rate is, for example, 100 μm/h or more, preferably 500 μm/h or more, and more preferably 1000 μm/h or more.

The production method of the present invention can be performed as described above. However, the production method of the present invention is not limited thereto. For example, as described above, in the step of producing a Group III nitride crystal, preferably, a reaction is performed in the presence of reducing gas in a reaction system. Furthermore, as described above, preferably, at least one of the oxidizing gas and the nitrogen-containing gas is mixed with the reducing gas. That is, in FIG. 2 or 4, at least one of nitrogen-containing gas 23a and 23b and oxidizing gas 21a (or 41a) may be mixed with the reducing gas. In the production method of the present invention, more preferably, the oxidizing gas is mixed with the reducing gas. Thereby, for example, in the Group III metal oxidation product gas generation step, the generation of a by-product in the reaction of the Group III metal and the oxidizing gas can be inhibited and the reaction efficiency (the generation efficiency of the Group III metal oxidation product gas) can further be improved. Specifically, for example, in the reaction of gallium (the Group III metal) and $H_2O$ gas (the oxidizing gas), by mixing $H_2O$ gas with $H_2$ gas (the reducing gas), the generation of $Ga_2O_3$, which is a by-product, can be inhibited and the generation efficiency of $Ga_2O$ gas (the Group III metal oxidation product gas) can be further improved.

Figure 20:
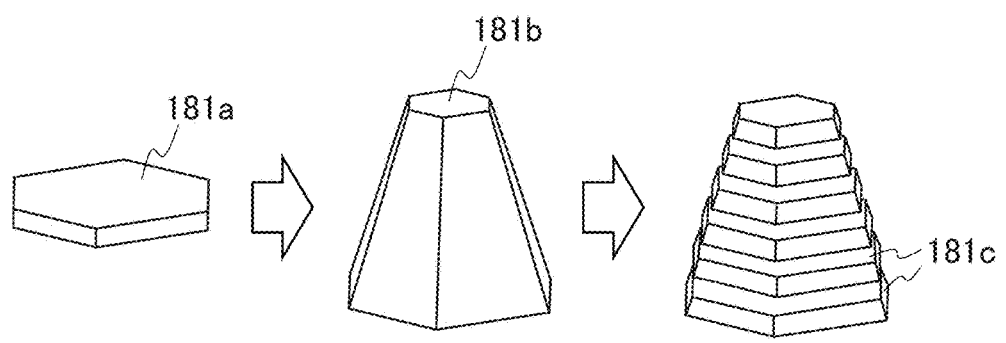
FIG. 20 is a perspective view schematically showing a Group III nitride crystal and an example of the method of producing a semiconductor wafer using the same.

Furthermore, in the production method of the present invention, when the reaction is performed in the presence of the reducing gas in a reaction system, for example, a bigger Group III nitride crystal can be produced. The detail is described with reference to FIG. 20 as an example. FIG. 20 is a perspective view schematically showing a Group III nitride crystal and an example of the method of producing a semiconductor wafer using the same. As shown in FIG. 20, by allowing Group III nitride crystal 181b to grow on seed crystal 181a and then slicing the Group III nitride crystal 181b, plate-like semiconductor wafer 181c formed of a Group III nitride crystal is produced. However, because the Group III nitride crystal 181b tends to have a tapered pyramid shape as shown in FIG. 20 as it grows, only a small semiconductor wafer is obtained at the tip of the pyramid-shaped crystal 181b. It is to be noted that, in the production method of the present invention, when the reaction is performed in the presence of the reducing gas in a reaction system, a columnar (i.e., not tapered) crystal instead of a pyramid-shaped crystal tends to be obtained although the reason is unknown. Different from a pyramid-shaped crystal, when such a columnar Group III nitride crystal is sliced, semiconductor wafers (Group III nitride crystals) each having a large diameter can be obtained in most parts.

In the production method of the present invention, examples of the reducing gas include hydrogen gas; carbon monoxide gas; hydrocarbon gas such as methane gas, ethane gas, or the like; hydrogen sulfide gas; and sulfur dioxide gas, and one of them may be used alone or two or more of them may be used in combination. Among them, hydrogen gas is particularly preferable. The hydrogen gas with high purity is preferable. The purity of the hydrogen gas is particularly preferably 99.9999% or more.

When the Group III metal oxidation product gas generation step is performed in the presence of the reducing gas, there is no particular limitation on the reaction temperature. From the viewpoint of the inhibition of generation of a by-product, the reaction temperature is preferably 900° C. or higher, more preferably 1000° C. or higher, and still more preferably 1100° C. or higher. The upper limit of the reaction temperature is not particularly limited, and is, for example, 1500° C. or lower.

When the reducing gas is used in the production method of the present invention, there is no particular limitation on the amount of the reducing gas to be used. The amount of the reducing gas with respect to the total volume of the oxidizing gas and the reducing gas is, for example, in the range from 1 to 99 vol. %, preferably in the range from 3 to 80 vol. %, and more preferably in the range from 5 to 70 vol. %. The flow rate of the reducing gas can be set appropriately according to the flow rate of the oxidizing gas or the like. The flow rate of the reducing gas is, for example, in the range from 0.01 to 100 Pa·m$^3$/s, preferably in the range from 0.05 to 50 Pa·m$^3$/s, and more preferably in the range from 0.1 to 10 Pa·m$^3$/s. Furthermore, as described above, generation of Group III metal oxidation product gas 101a (101b) may be performed in a condition under pressure, in a condition under reduced pressure, or in conditions other than these conditions, for example. The pressure is, for example, as described above. There is no particular limitation on the method of adjusting the pressure, and the pressure can be adjusted, for example, by the oxidizing gas and the reducing gas.

[2. Group III Nitride Crystal, Semiconductor Apparatus, and the Like of the Present Invention]

The Group III nitride crystal of the present invention is, as described above, a Group III nitride crystal produced by the production method of the present invention. There is no particular limitation on the shape of the Group III nitride crystal of the present invention. For example, as shown in FIG. 5, the Group III nitride crystal of the present invention may be crystal 53 generated in the shape of a layer at the side of seed crystal 52 of substrate 50 in which seed crystal 52 is disposed on underlayer 51. Also, the shape of the Group III nitride crystal of the present invention is not limited to the shape of a layer, and can be in the shape of a needle, a feather, a plate, a pyramid, or a column, for example. Furthermore, the Group III nitride crystal of the present invention may be, for example, a single crystal or a polycrystalline.

The concentration of oxygen contained in the Group III nitride crystal of the present invention is preferably $1\times10^{20}$ cm$^{-3}$ or less, more preferably $1\times10^{18}$ cm$^{-3}$ or less, and still more preferably $5\times10^{16}$ cm$^{-3}$ or less. However, the Group III nitride crystal of the present invention is not limited thereto, and the concentration of oxygen may be $1\times10^{20}$ cm$^{-3}$ or more. The concentration of oxygen contained in the crystal can be measured, for example, by carrying out the secondary ion mass spectrometry (SIMS) of a Group III nitride crystal under the following conditions. However, the following measuring instrument and measurement conditions are merely illustrative, and the present invention is by no means limited thereby.

Mass spectrometer: "ims-7f" (product name), manufactured by CAMECA
Primary ion: Cs$^+$
Secondary ion: Negative
Primary ion energy: 15.0 keV
Primary ion current: 35 nA
Raster area: 90 μm×90 μm
Analysis region: Φ30 μm Ions to be measured: H⁻ (1 m/e), C⁻ (12 m/e), O⁻ (16 m/e), Si⁻ (29 m/e), Ga⁻ (69 m/e)
Detection limit: C (to $6 \times 10^{16}$ cm$^{-3}$), O (to $6 \times 10^{16}$ cm$^{-3}$), Si (to $1 \times 10^{17}$ cm$^{-3}$)

The thickness of the Group III nitride crystal of the present invention is not particularly limited, and is, for example, in the range from 0.0005 to 100000 μm, in the range from 0.001 to 50000 μm, or in the range from 0.01 to 5000 μm. There is no particular limitation on the upper limit of the thickness. The thicker Group III nitride crystal is preferable because it is easily applicable to a large product and the like. Furthermore, the thick crystal can be sliced so as to have an arbitrary thickness when it is used, for example.

The Group III nitride crystal of the present invention is, for example, a large crystal of high quality with less defects. There is no particular limitation on the dislocation density of the Group III nitride crystal produced by the production method of the present invention. The dislocation density is preferably low, and is, for example, $1 \times 10^2$ cm$^{-2}$ or less. The dislocation density is preferably less than $1 \times 10^2$ cm$^{-2}$, more preferably 50 cm$^{-2}$ or less, still more preferably 30 cm$^{-2}$ or less, still more preferably 10 cm$^{-2}$ or less, and particularly preferably 5 cm$^{-2}$ or less. The lower limit of the dislocation density is not particularly limited, and is ideally 0 or the value at most the measurement limit of the measuring instrument. The value of the dislocation density may be an average value of the whole crystal, for example. It is more preferable if the maximum value of the dislocation density in the crystal is the aforementioned value or less. Furthermore, in the Group III nitride crystal of the present invention, the half width of each of a symmetric reflection component (002) and an asymmetric reflection component (102) by XRC (X-ray rocking curve method) is not particularly limited, and is, for example, 100 seconds or less and preferably 30 seconds or less. The lower limit of the XRC half width is not particularly limited, and is ideally 0 or the value at most the measurement limit of the measuring instrument.

The X-ray rocking curve half width of the Group III nitride crystal of the present invention can be measured, for example, by an X-ray diffractometer ("SLX-2000" (product name), manufactured by Rigaku Corporation) under the following conditions. However, the following measuring instrument and measurement conditions are merely illustrative, and the present invention is by no means limited thereby.
X radiation source: CuKα λ=1.54 Å (0.154 nm)
X-ray spot diameter: height (Hs)=1 mm, width (Ws)=0.1 to 0.5 mm
Tube voltage/Tube current: 50 kV/300 mA There is no particular limitation on the use of the Group III nitride crystal of the present invention. For example, the Group III nitride crystal of the present invention can be used for a semiconductor apparatus because it has a property of semiconductor. The semiconductor apparatus of the present invention is, as described above, a semiconductor apparatus including the Group III nitride crystal of the present invention which is a semiconductor.

Because the Group III nitride crystal of the present invention is, for example, a large crystal of high quality with less defects, it can provide a semiconductor apparatus of significantly high-performance. Furthermore, according to the present invention, for example, as described above, it is possible to provide a Group III nitride (e.g., GaN) crystal having a diameter of 6 inches or more, which could not be achieved by a conventional art. Therefore, for example, by using a Group III-V compound as a substitute for Si in a semiconductor apparatus such as a power device, an LED, and the like commonly required to have a large diameter of Si (silicon), further improvement in performance is possible. Therefore, the present invention exerts a great impact on the semiconductor industry.

There is no particular limitation on the semiconductor apparatus of the present invention, and the semiconductor apparatus can be any article as long as it is operated by using a semiconductor. Examples of the article operated by a semiconductor include semiconductor devices, inverters, and electrical equipment using the semiconductor devices, the inverters, and the like. The semiconductor apparatus of the present invention may be, for example, various kinds of electrical equipment such as cellular phones, liquid crystal televisions, lighting equipment, power devices, laser diodes, solar cells, high frequency devices, displays, and the like or semiconductor devices, inverters, and the like used for the aforementioned electrical equipment. There is no particular limitation on the semiconductor device, and examples thereof include laser diodes (LDs) and light-emitting diodes (LEDs). For example, a laser diode (LD) that emits blue light is applied to a high density optical disk, a display, and the like, and a light-emitting diode (LED) that emits blue light is applied to a display, a lighting, and the like. An ultraviolet LD is expected to be applied in biotechnology and the like and an ultraviolet LED is expected as an ultraviolet source which is an alternate for a mercury lamp. Also, an inverter that uses the Group III nitride crystal of the present invention as a power semiconductor for inverter can be used for power generation in a solar cell, for example. As described above, the Group III nitride crystal of the present invention is not limited thereto, and can be applied to other semiconductor apparatuses or various technical fields.

EXAMPLES

The examples of the present invention are described below. It is to be noted, however, that the present invention is by no means limited or restricted by the following examples.

Example 1

A Group III nitride crystal was produced by an apparatus having the configuration shown in FIG. 1.

In the present example, a container made of stainless was used as the second container, and gallium (purchased from RASA Industries, LTD.) was used as the Group III metal.

Figure 6A:
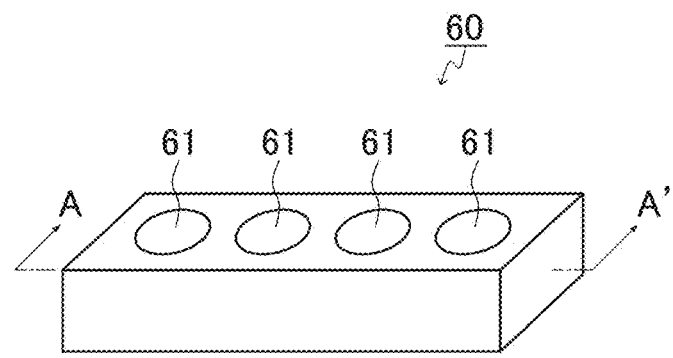
FIGS. 6A and 6B are schematic views each showing an example of the container for containing a Group III metal.
Figure 6B:
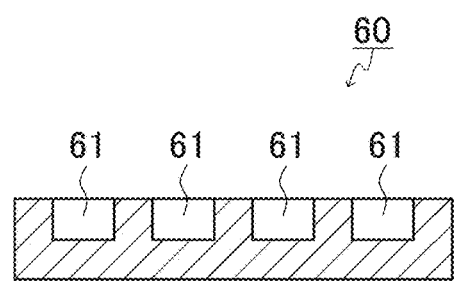

Furthermore, an alumina boat was disposed in the second container for containing the gallium, and the gallium was contained therein. FIGS. 6A and 6B each show the overview of the structure of the alumina boat. In FIGS. 6A and 6B, in order to make it clearly understandable, the size, the ratio, and the like of components are different from actual ones. FIG. 6A is a perspective view and FIG. 6B is a cross sectional view taken along line A-A' in FIG. 6A. As shown in FIGS. 6A and 6B, this alumina boat 60 is a cuboid including concaved portions 61 for containing gallium on its upper surface. As shown in the cross sectional view of FIG. 7, gallium 100 can be contained in the concaved portion 61 and oxidizing gas 21a flowing above the alumina boat 60 is caused to react at the surface of the gallium 100 (oxidizing gas 21b), whereby Group III oxidation product gas 101 (Ga$_2$O in FIG. 7) can be generated. In the present example, the total weight of the gallium contained in the concaved portion 61 of the alumina boat 60 was about 1 g. One grain of gallium (purchased from RASA Industries, LTD. as described above) used in the present example and in the following examples was about 1 g. An excessive amount of gallium was used in the present example and in the following example. Because one grain of gallium was used in the present example, gallium was contained in only one concaved portion 61.

Figure 15A:
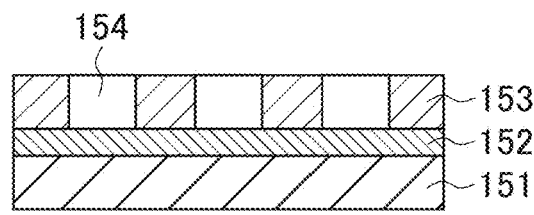
FIGS. 15A and 15B are schematic views, each showing the structure of the substrate used in Example.
Figure 15B:
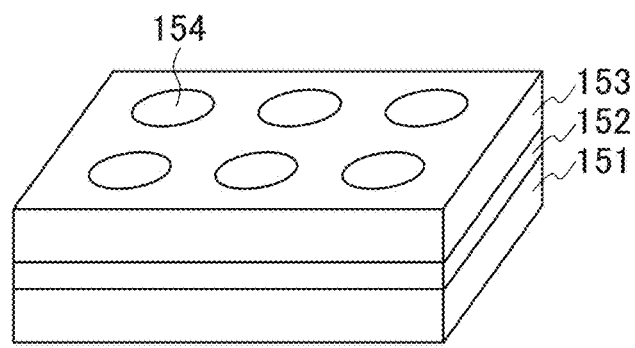
Figure 16A:
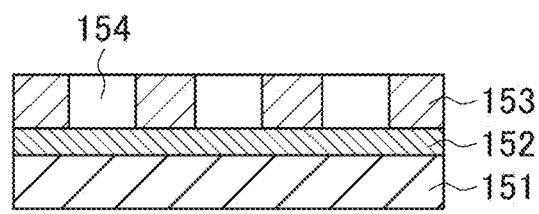
FIG. 16 (a) to (c) is a cross sectional view schematically showing an example of the state of crystal growth in the method of producing a Group III nitride crystal using the substrate shown in FIG. 15.
Figure 16B:
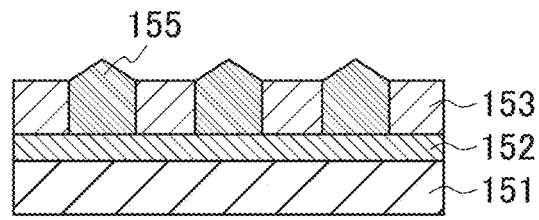
Figure 16C:
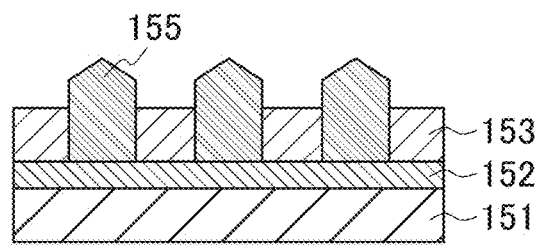

In the present example, as the substrate, a substrate in which a GaN film crystal having a thickness of 10 μm (MOVPE-GaN film crystal (thickness: 10 μm), "GaN template" (product name), manufactured by TDI) generated by the MOVPE method as a seed crystal is disposed on an underlayer (thickness: 400 μm) made of sapphire was used. Furthermore, when the GaN film crystal (seed crystal) was used, a mask having plural through-holes was placed thereon. FIGS. 15A and 15B schematically show the structure of the substrate. FIG. 15A is a cross sectional view and FIG. 15B is a perspective view. In FIGS. 15A and 15B, in order to make it clearly understandable, the size, the ratio, and the like of components are different from actual ones. As shown in FIGS. 15A and 15B, this substrate includes underlayer 151, seed crystal (GaN film crystal) 152 stacked on the underlayer 151, and mask 153 stacked on the seed crystal (GaN film crystal) 152. The mask 153 has plural through-holes 154 and the surfaces of the seed crystals (GaN film crystals) 152 are exposed through the through-holes 154. The process diagram of FIG. 16 (*a*) to (*c*) schematically shows an example of the crystal growth in the method of producing a Group III nitride crystal using the substrate shown in FIG. 15. It is to be noted that FIG. 16 (*a*) to (*c*) is a schematic view for convenience of explanation, and by no means limits the present example and the present invention. In FIG. 16 (*a*) to (*c*), in order to make it clearly understandable, the size, the ratio, and the like of components are different from actual ones. (a) of FIG. 16 shows the state of a substrate (the same state as shown in FIG. 15A) before a Group III nitride crystal (GaN crystal in the present example) is grown, (b) of FIG. 16 shows the state where the Group III nitride crystal is grown, and (c) of FIG. 16 shows the state where the Group III nitride crystal is further grown. When Group III oxidation product gas comes into contact with the surface of the seed crystal (GaN film crystal) 152 exposed from the through-hole 154, the seed crystal (GaN film crystal) 152 is reacted with the Group III oxidation product gas, whereby Group III nitride crystal (GaN crystal in the present example) 155 is grown as shown in FIG. 16 (a) to (c). The Group III nitride crystal 155 protrudes from the through-hole 154 and keeps growing.

The production of the GaN crystal in the present example was performed as follows. First, the gallium and the substrate were heated. Subsequently, in this state, mixed gas of $H_2O$ gas (oxidizing gas) and nitrogen gas (carrier gas) was introduced from the oxidizing gas introduction tube. In the mixed gas, the flow rate of the $H_2O$ gas was $1.69\times10^{-2}$ Pa·m³/s and the flow rate of the nitrogen gas was 3.21 Pa·m³/s. The proportion of the $H_2O$ gas in the mixed gas was 0.5 vol. % and the proportion of the nitrogen gas in the mixed gas was 99.5 vol. %. Also, mixed gas of ammonia gas (A) and nitrogen gas (B) was introduced from the nitrogen-containing gas introduction tube as nitrogen-containing gas. The flow rate of the ammonia gas (A) was 0.51 Pa·m³/s and the flow rate of the nitrogen gas (B) was 4.56 Pa·m³/s. The mixing ratio A:B (volume ratio) between the ammonia gas (A) and the nitrogen gas (B) was 10:90. Thus generated $Ga_2O$ gas was reacted with the introduced nitrogen-containing gas, whereby a GaN crystal was generated on the substrate. The generation of $Ga_2O$ gas was performed under the conditions that the temperature of gallium was 1150° C. and the pressure was $1.00\times10^5$ Pa. The generation of the GaN crystal was performed for 0.5 hours under the conditions that the supply amount of the $Ga_2O$ gas was $1.0\times10^{-3}$ mol/hour, the temperature of the substrate was 1200° C., and the pressure was $1.0\times10^5$ Pa. In this manner, the GaN crystal of the present example was obtained on the MOVPE-GaN film crystal (thickness: 10 μm) as an epitaxial layer having a thickness of 36 μm.

Example 2

Figures 7, 8:
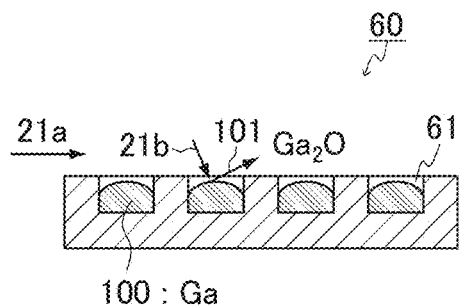
FIG. 7 is a cross sectional view schematically showing an example of the method of producing a Group III nitride crystal according to the present invention using the container shown in FIG. 6.
FIG. 8 shows photographs, each showing the state of a Group III metal container after production of Group III nitride crystal in an Example.

The production (growth) of a GaN crystal was performed in the same manner as in Example 1 except that the reaction conditions (also referred to as crystal growth condition or simply as growth condition) were changed as shown in FIG. 8. In FIG. 8, the flow rate (supply amount) of gas is expressed in "sccm", and 1 sccm denotes $1.7\times10^{-3}$ Pa·m³/s. It is to be noted that the same meaning of the "sccm" is applied throughout the following drawings and examples. "Growing part temperature" in FIG. 8 indicates the temperature of the substrate (substrate 22 in FIG. 2), and was adjusted by the second heating units (heaters) 20*a* and 20*b* shown in FIG. 2. "Source temperature" in FIG. 8 indicates the temperature of the gallium (Group III metal 100 in FIG. 2), and was adjusted by the first heating units (heaters) 19*a* and 19*b* shown in FIG. 2. "$H_2O$ carrier nitrogen" in FIG. 8 indicates the nitrogen gas which was mixed with $H_2O$ gas as carrier gas. "$NH_3/N_2$" indicates the mixing ratio (flow rate ratio) between ammonia gas ($NH_3$) and nitrogen gas ($N_2$) in nitrogen-containing gas. "Seed substrate: c-GaN/Sapp." indicates that the same substrate as Example 1 was used as a substrate.

As can be seen from "Growth rate" in FIG. 8, under any of the reaction conditions (growth conditions), a GaN crystal was grown at the growth rate described in FIG. 8 and a target GaN crystal could be produced efficiently with high reactivity. The SEM image of the cross section of the GaN crystal is shown in the "SEM image" section in FIG. 8. The melting point of metal gallium used in the present example is about 30° C. which is low and the metal gallium is in a liquid state at room temperature under the reaction conditions. Thus, the metal gallium is superior in reactivity and it allows easy continuous supply or the like. As can be seen from the photography of the boat after growth shown in FIG. 8, in the present example, $Ga_2O_3$, which is a by-product, was slightly generated on the alumina boat.

In the present example, the generation amount of $Ga_2O$ gas was calculated on the basis of the reduced amount of Ga, the generation amount of $Ga_2O_3$, and the like. The same applies to the following examples. In each of the following examples, the apparatus used for the production (growth) of a GaN crystal was the same as that of Example 1, and the reaction conditions (crystal growth conditions) were the same as those in Example 1, unless otherwise stated.

Example 3

In the present example, the inhibitory effect of the generation of by-product $Ga_2O_3$ in the case where $H_2O$ gas (oxidizing gas) was mixed with $H_2$ gas (reducing gas) was examined. As shown in the reaction conditions (growth conditions) of FIG. 10, the reaction was performed in both of the condition in which $H_2O$ gas (oxidizing gas) was not mixed with $H_2$ gas (reducing gas) (left view in FIG. 10) and the condition in which $H_2O$ gas (oxidizing gas) was mixed with $H_2$ gas (reducing gas) at the flow rate of 100 sccm (right view in FIG. 10). "$H_2O$" described at the upper right in FIG. 10 indicates the flow rate (sccm) of $H_2O$ gas. "$N_2$" indicates the flow rate (sccm) of nitrogen gas which was mixed with $H_2O$ gas as carrier gas. In the present example, nitrogen-containing gas is mixed gas of ammonia gas and nitrogen gas as in Examples 1 and 2, and the flow rate of ammonia gas and the flow rate of nitrogen gas were the same as those in Example 2 (FIG. 8) although they are not shown. "Source temperature" indicates the temperature of the gallium (Group III metal 100 in FIG. 2), and was adjusted by the first heating units (heaters) 19a and 19b shown in FIG. 2. The temperature of the substrate (growing part temperature) was the same as that of Example 2 (FIG. 8) although it is not shown. The time for growth is 1 hour as in Example 2 (FIG. 8) although it is not shown. "Photography of source boat after growth" shows the photographs of the alumina boats after completion of reaction (after GaN crystal growth) and is the same as "Photography of boat after growth" in FIG. 8. As can be seen from FIG. 10, there is little difference between the generation rate of $Ga_2O$ gas in the case where $H_2O$ gas was not mixed with $H_2$ gas (left view in FIG. 10) and the generation rate of $Ga_2O$ gas in the case where $H_2O$ gas was mixed with $H_2$ gas (right view in FIG. 10). However, by-product $Ga_2O_3$ was slightly generated in the case where $H_2O$ gas was not mixed with $H_2$ gas (left view in FIG. 10), whereas by-product $Ga_2O_3$ was not generated and reaction efficiency was improved in the case where $H_2O$ gas was mixed with $H_2$ gas (right view in FIG. 10). The growth rate of GaN in the case where $H_2O$ gas was not mixed with $H_2$ gas (left view in FIG. 10) was 56 μm/h and the growth rate of GaN in the case where $H_2O$ gas was mixed with $H_2$ gas (right view in FIG. 10) was 72 μm/h, and in either case, a target GaN crystal could be produced efficiently with high reactivity.

Figures 9, 10:
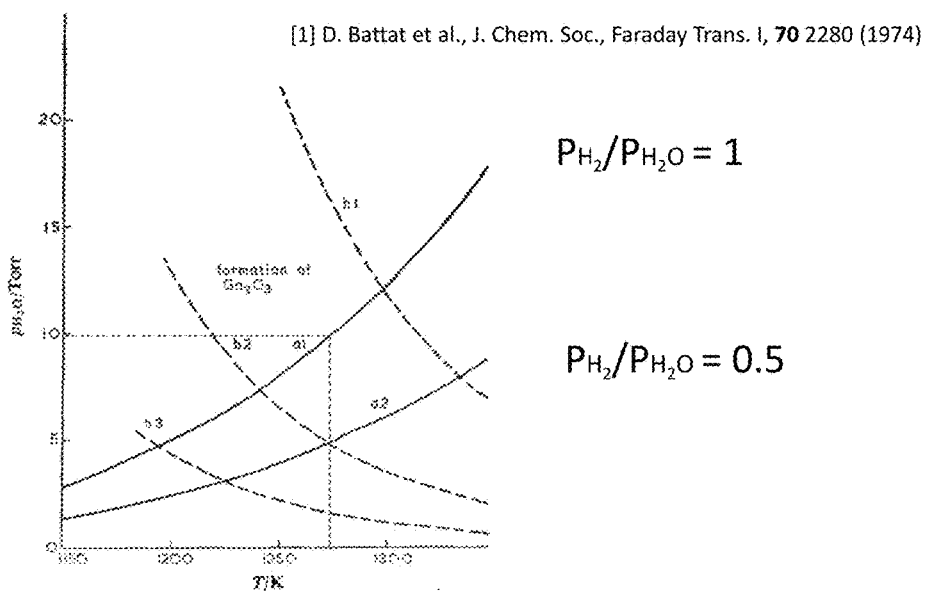
FIG. 9 is a graph showing an example of the relationship between the partial pressures of $H_2$ gas and $H_2O$ gas and the generation amount of $Ga_2O_3$ in the reaction of metal gallium and $H_2O$ gas.
FIG. 10 shows photographs, each showing the state of a Group III metal container after production of Group III nitride crystal in another Example.

FIG. 9 is a graph showing an example of the relationship among the partial pressure of $H_2$ gas, the reaction temperature, and the generation of $Ga_2O_3$ in the case where metal gallium was caused to react with mixed gas of $H_2O$ gas and $H_2$ gas. In FIG. 9, the vertical axis indicates the pressure (Torr) of $H_2O$ gas and the horizontal axis indicates the reaction temperature (K). $Ga_2O_3$ is generated in the condition higher than two solid curves in FIG. 9 (the conditions in which the partial pressures of $H_2$ gas are respectively as follows: $P_{H2}/P_{H2O}=1$ and $P_{H2}/P_{H2O}=0.5$). However, FIG. 9 is merely illustrative for reference, and by no means limits the present example and the present invention.

Example 4

In the present example, the inhibitory effect of the generation of by-product $Ga_2O_3$ in the case where $H_2O$ gas (oxidizing gas) was mixed with $H_2$ gas (reducing gas) and the temperature of gallium (i.e., temperature of reaction of gallium and $H_2O$ gas) was variously changed was examined. FIG. 11 shows the reaction conditions and the photographs of boats after growth of the present example. In FIG. 11, "$T_{source}$ (° C.)" indicates the temperature of the gallium (Group III metal 100 in FIG. 2), and was adjusted by the first heating units (heaters) 19a and 19b shown in FIG. 2. The conditions other than this were the same as in the case where $H_2$ gas (reducing gas) was added in Example 3 (right view in FIG. 10). As can be seen from FIG. 11, the generation amount of by-product $Ga_2O_3$ was decreased as the temperature of the reaction of gallium and $H_2O$ gas was increased, and the generation amount of by-product $Ga_2O_3$ was 0 when the temperature of the reaction of gallium and $H_2O$ gas was 1150° C. The growth rate of GaN was 4 μm/h in the condition in which the temperature of the reaction of gallium and $H_2O$ gas was 1000° C. (leftmost view in FIG. 11), 12 μm/h in the condition in which the reaction temperature was 1100° C. (middle view in FIG. 11), and 72 μm/h in the condition in which the reaction temperature was 1150° C. (rightmost view in FIG. 11) and, in any of these conditions, a target GaN crystal could be produced efficiently with high reactivity.

Example 5

Figure 13:
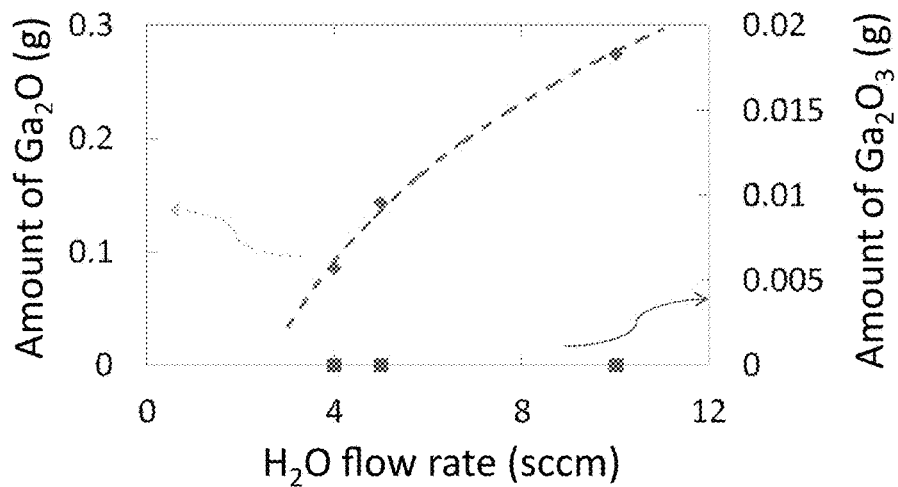
FIG. 13 is a graph showing the relationship between the flow rate of $H_2O$ and the generation amount of $Ga_2O$ in an Example.

In the present example, the inhibitory effect of the generation of by-product $Ga_2O_3$ in the case where $H_2O$ gas (oxidizing gas) was mixed with $H_2$ gas (reducing gas) and the flow rate of $H_2O$ gas (oxidizing gas) was variously changed was examined. FIG. 12 shows the reaction conditions and the photographs of boats after growth of the present example. The reaction conditions (growth conditions) were the same as in the case where $H_2$ gas (reducing gas) was added in Example 3 (right view in FIG. 10) except that the flow rate (sccm) of $H_2O$ gas was changed to 4 sccm, 5 sccm, or 10 sccm as shown in FIG. 12. As can be seen from FIG. 12, the higher the flow rate of $H_2O$ gas (oxidizing gas), the higher the generation amount (g/h) of $Ga_2O$ gas and the reaction efficiency. Also as can be seen from FIG. 12, in any of the conditions, by-product $Ga_2O_3$ was not generated. The graph of FIG. 13 shows the relationship between the flow rate of the $H_2O$ gas (oxidizing gas) and the generation amounts of $Ga_2O$ gas and by-product $Ga_2O_3$ in the present example. In FIG. 13, the horizontal axis indicates the flow rate (sccm) of the $H_2O$ gas (oxidizing gas) and the vertical axis indicates the generation amount (g) of the $Ga_2O$ gas or the by-product $Ga_2O_3$. As can be seen from FIG. 13, the higher the flow rate of $H_2O$ gas (oxidizing gas), the higher the generation amount of $Ga_2O$ gas and the reaction efficiency. Also as can be seen from FIG. 13, in any of the conditions, by-product $Ga_2O_3$ was not generated. In the condition in which the flow rate of $H_2O$ gas (oxidizing gas) was 10 sccm, the generation of by-product $Ga_2O_3$ was found only slightly in a circled area in the photograph of the boat after growth in FIG. 12, which however was ignorable amount (can be considered as 0). The growth rate of GaN was 16 μm/h in the condition in which the flow rate of $H_2O$ gas was 4 sccm (leftmost view in FIG. 12), 24 μm/h in the condition in which the flow rate of $H_2O$ gas was 5 sccm (middle view in FIG. 12), and 72 μm/h in the condition in which the flow rate of $H_2O$ gas was 10 sccm (rightmost view in FIG. 12), and in any of these conditions, a target GaN crystal could be produced efficiently with high reactivity.

Example 6

The production (growth) of a GaN crystal of the present example was performed in the same manner as in Example 1 except that the reaction conditions (crystal growth conditions) were set as shown in Table 1, and the impurity concentration in the produced GaN crystal was checked. In Table 1, "$H_2O/H_2/N_2$ (sccm)" respectively indicates the flow rates (sccm) of $H_2O$ gas, $H_2$ gas, and $N_2$ gas in the mixed gas of $H_2O$ gas, $H_2$ gas, and $N_2$ gas introduced from the oxidizing gas introduction tube 15. In Table 1, "$NH_3/H_2/N_2$ (sccm)" respectively indicates the flow rates (sccm) of $NH_3$ gas, $H_2$ gas, and $N_2$ gas in the mixed gas of $NH_3$ gas, $H_2$ gas, and $N_2$ gas introduced from the nitrogen-containing gas introduction tube 17a and 17b. "HVPE c-GaN substrate (self-supporting)" denotes that an HVPE GaN self-supporting substrate was used instead of the substrate and the GaN film crystal (seed crystal) of Example 1. This self-supporting substrate is formed of a GaN crystal produced by HVPE (vapor phase epitaxy), and the self-supporting substrate itself is a "seed substrate" which also serves as a GaN seed crystal. The crystal growth plane of the self-supporting substrate (seed substrate) is a c-plane. "XRC-FWHM" indicates the FWHM (half width) measured by XRC (X-ray rocking curve method). In the present example, the GaN crystal could be grown with the growth rate of 24 µm/h, which is high.

TABLE 1

| | |
|---|---|
| Growing part temperature (° C.) | 1200 |
| Source temperature (° C.) | 1150 |
| $H_2O/H_2/N_2$ (sccm) | 5/100/0 |
| $NH_3/H_2/N_2$ (sccm) | 1500/1500/500 |
| Seed substrate | HVPE c-GaN substrate (self-supporting) XRC-FWHM: 76 arcsec |
| Time for growth (min) | 15 |

Figure 17:
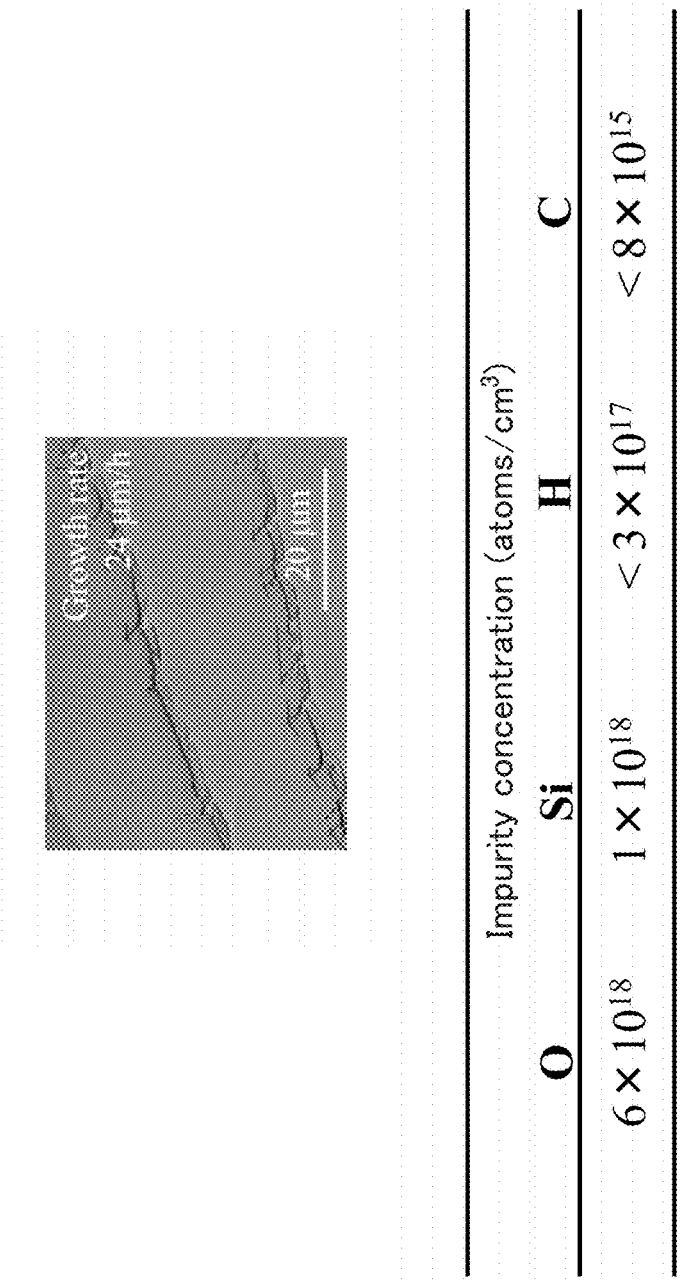
FIG. 17 shows a photograph of a GaN crystal produced (grown) in still another Example.

FIG. 17 shows the SEM image (bird's-eye image) of the surface of the GaN crystal produced in the present example and impurity concentration (atoms/cm$^3$, i.e., the number of atoms in 1 cm$^3$). The concentrations of impurities were measured using a mass spectrometer "ims-6f" (product name) manufactured by CAMECA under the following measurement conditions.
Mass spectrometer: "ims-6f" (product name), manufactured by CAMECA
Primary ion: Cs$^+$
Secondary ion: Negative
Primary ion energy: 14.5 keV
Primary ion current: 35 nA
Raster area: 100 µm×100 µm
Analysis region: Φ30 µm
Ions to be measured: H$^-$ (1 m/e), C$^-$ (12 m/e), O$^-$ (16 m/e), Si$^-$ (29 m/e), Ga$^-$ (69 m/e)
Detection limit: C (to $6\times10^{16}$ cm$^{-3}$), O (to $6\times10^{16}$ cm$^{-3}$), Si (to $1\times10^{17}$ cm$^{-3}$)

As can be seen from FIG. 17, the concentrations of impurities (oxygen atom, silicon atom, hydrogen atom, and carbon atom) in the GaN crystal produced in the present example were low, and a GaN crystal with high purity could be obtained. In particular, the concentration of hydrogen atom was less than $3\times10^{17}$ atoms/cm$^3$ and the concentration of carbon atom was less than $8\times10^{15}$ atoms/cm$^3$, which are significantly low. In contrast, for the purpose of introducing impurities into a Group III nitride crystal, for example, gas that contains the elements of the above-described impurities may also be used in the Group III nitride crystal production step.

Example 7

The production (growth) of a GaN crystal of the present example was performed in the same manner as in Example 1 except that the reaction conditions (crystal growth conditions) were set as shown in Table 2. In Table 2, the meanings of "$H_2O/H_2/N_2$ (sccm)", "$NH_3/H_2/N_2$ (sccm)", "HVPE c-GaN substrate (self-supporting)" and "XRC-FWHM" are the same as those in Table 1 (Example 6).

TABLE 2

| | |
|---|---|
| Growing part temperature (° C.) | 1200 |
| Source temperature (° C.) | 1200 |
| $H_2O/H_2/N_2$ (sccm) | 5/100/400 |

TABLE 2-continued

| | |
|---|---|
| $NH_3/H_2/N_2$ (sccm) | 500/2000/500 |
| Seed substrate | HVPE c-GaN substrate (self-supporting) XRC-FWHM: 104 arcsec |
| Time for growth (min) | 15 |

The leftmost view of FIG. 18 shows the SEM image (bird's-eye image) of the surface of the GaN crystal produced under the conditions shown in Table 2 together with the partial pressure (Pa) of $Ga_2O$ gas, the growth rate (µm/h), and the FWHM (half width) measured by XRC in the GaN crystal growth. As can be seen from the leftmost view of FIG. 18, the growth rate was 26 µm/h, which is significantly high. In the present example, the partial pressure of $Ga_2O$ gas was calculated on the basis of the reduced amount of Ga weight obtained by subtracting the Ga weight after completion of reaction from the Ga weight before start of reaction. More specifically, on the presumption that 100% of the reduced amount of Ga weight was changed into $Ga_2O$ gas, the partial pressure of $Ga_2O$ gas was calculated from the amount of $Ga_2O$ gas calculated on the basis of the presumption.

Furthermore, the production (growth) of a GaN crystal was performed under the same conditions as those shown in Table 2 except that the partial pressure of $Ga_2O$ gas to be generated was changed by changing the amount of gallium to change the size of the contact area between gallium and gas. The middle view and leftmost view of FIG. 18 each show the SEM image (bird's-eye image) of the surface of the thus obtained GaN crystal together with the partial pressure (Pa) of $Ga_2O$ gas, the growth rate (µm/h), and the FWHM (half width) measured by XRC in the GaN crystal growth. The leftmost view of FIG. 18 shows, as described above, an example of the GaN crystal produced under the conditions shown in Table 2. In this example, when one grain (about 1 g) of gallium was used in the same manner as in Example 1, the partial pressure of $Ga_2O$ gas was 42 Pa. The middle view of FIG. 18 shows an example of the GaN crystal produced under the same conditions as those shown in Table 2 except that three grains (about 3 g) of gallium were used. In this example, as a result of using three grains (about 3 g) of gallium, the partial pressure of $Ga_2O$ gas was 147 Pa. The rightmost view of FIG. 18 shows an example of the GaN crystal produced under the same conditions as those shown in Table 2 except that six grains (about 6 g) of gallium were used. In this example, as a result of using six grains (about 6 g) of gallium, the partial pressure of $Ga_2O$ gas was 230 Pa. As can be seen from the middle and rightmost views of FIG. 18, by increasing the partial pressure of $Ga_2O$ gas to 147 Pa and 230 Pa, the growth rate of GaN became 74 µm/h and 104 µm/h, respectively, which are significantly high. Furthermore, as can be seen from the SEM images (bird's-eye images) and the FWHM values, these GaN crystals were crystals of high quality with significantly less defects as in the case of the growth rate of 26 µm/h (condition shown in Table 2). In other words, it was confirmed that a GaN crystal could be produced at at least the crystal growth rate of 104 µm/h according to the present invention.

Example 8

In the present example, a GaN crystal was produced in the presence of $H_2$ gas (reducing gas) in a reaction system, and it was confirmed that a columnar crystal was obtained. An apparatus having the configuration shown in FIG. 1 was used as a production apparatus. The flow rate (supply amount) of each gas, the temperature of gallium, and the temperature of a substrate were set as the following (1) to (5). A substrate and a mask having the structure shown in FIG. 15 were used as a substrate and a mask as in the case of Example 1. Also as in the case of Example 1, gallium was contained in alumina boat 60 having the structure shown in FIG. 6 and the total weight of gallium contained in concaved portion 61 of the alumina boat 60 was 1 g. The reaction time (time for growth of GaN crystal) was 1 hour. The conditions except for this were the same as those in Example 1.

(1) Amount (Flow Rate) of Gas Introduced from Oxidizing Gas Introduction Tube
  $H_2O$ gas: $6.76 \times 10^{-3}$ Pa·m$^3$/s
  $N_2$ gas: 3.21 Pa·m$^3$/s
  $H_2$ gas: $1.69 \times 10^{-1}$ Pa·m$^3$/s
(2) Amount (Flow Rate) of Gas Introduced from Nitrogen-Containing Gas Introduction Tube
  $NH_3$ gas: $5.07 \times 10^{-1}$ Pa·m$^3$/s
  $N_2$ gas: 1.69 Pa·m$^3$/s
  $H_2$ gas: 1.69 Pa·m$^3$/s
(3) Supply Amount of $Ga_2O$ Gas
  $1.47 \times 10^{-4}$ mol/h
(4) Temperature of Gallium
  1130° C.
(5) Temperature of Substrate
  1200° C.

Figure 19:
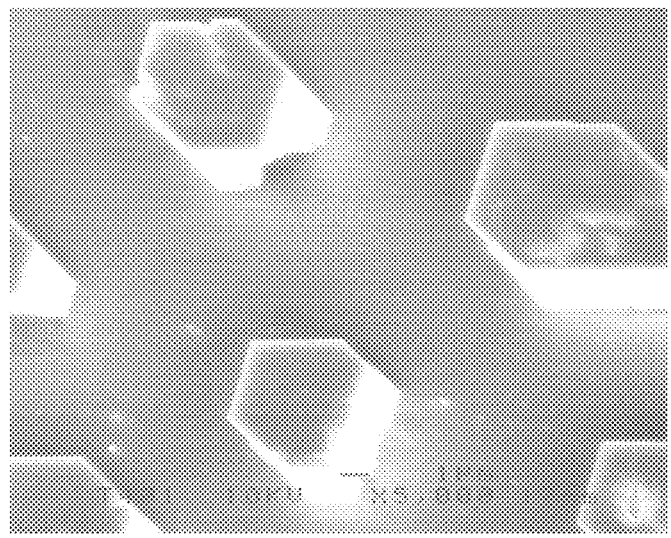
FIG. 19 shows a photograph showing the shapes of GaN crystals produced (grown) in still another Example.

FIG. 19 shows a micrograph of GaN crystals produced in the present example. As can be seen from FIG. 19, in the present example, hexagonal prismatic GaN crystals were obtained. Obtaining such columnar (i.e., not tapered) crystals instead of pyramid-shaped crystals is, as described above, very useful for obtaining a semiconductor wafer (Group III nitride crystal) having a large diameter and the like.

Figure 14:
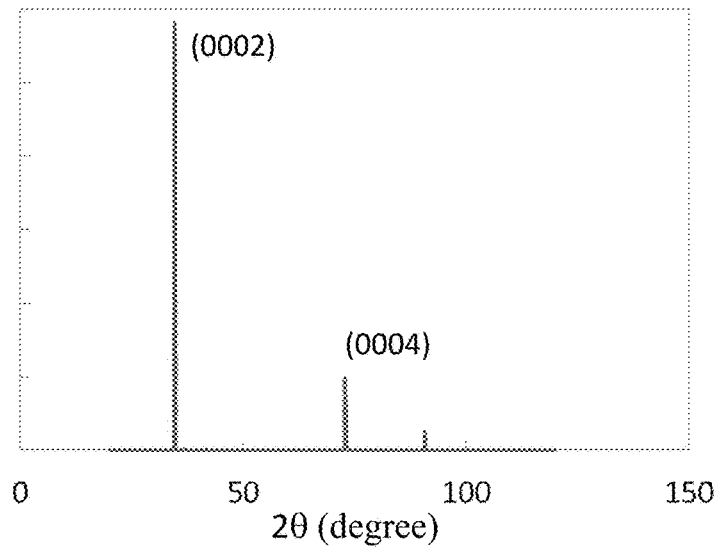
FIG. 14 is a graph showing the results of the X-ray analysis of the crystal structures of GaN crystals produced in an Example.

FIG. 14 is a graph showing the results (2θ/θ scanning results) of the X-ray analysis of the crystal structures of GaN crystals (produced under the condition in which by-product $Ga_2O_3$ was not generated) produced in Examples 1 to 8. As can be seen from FIG. 14, it was confirmed that GaN crystals with high purity were obtained.

INDUSTRIAL APPLICABILITY

As described above, according to the present invention, it is possible to provide a method of producing a Group III nitride crystal that prevents a halogen-containing by-product from adversely affecting crystal generation and is superior in reactivity and operability, a Group III nitride crystal, a semiconductor apparatus, and an apparatus for producing a Group III nitride crystal. The Group III nitride crystal of the present invention can be applied, for example, to optical devices such as light-emitting diodes, laser diodes, and the like; electronic devices such as rectifiers, bipolar transistors, and the like; and semiconductor sensors such as temperature sensors, pressure sensors, radiation sensors, visible light detectors, ultraviolet photodetectors, and the like. It is to be noted, however, that the present invention is not limited to the above-described applications and is applicable to a broad range of technical fields.

EXPLANATION OF REFERENCE NUMERALS 10, 30 production apparatus used in production method of the present invention
11 first container
12, 31 second container
13 substrate support portion
14 Group III metal placement portion
15 oxidizing gas introduction tube
16 Group III metal oxidation product gas delivery tube
17a, 17b nitrogen-containing gas introduction tube
18 exhaust tube
19a, 19b first heating unit
20a, 20b second heating unit
21a, 21b, 41a, 41b oxidizing gas
22, 40 substrate
23a, 23b, 23c nitrogen-containing gas
23d exhaust gas
24 GaN crystal
32 Group III metal introduction tube
42, 100 Group III metal
50 substrate
51 underlayer
52 seed crystal
53 Group III nitride crystal
60 alumina boat
61 concaved portion
101, 101a, 101b Group III metal oxidation product gas
181a seed crystal
181b Group III nitride crystal
181c semiconductor wafer

The invention claimed is:

1. A method of producing a Group III nitride crystal, the method comprising a step of:
  causing a Group III metal to react with an oxidizing agent and nitrogen-containing gas, wherein the Group III metal, oxidizing agent, and nitrogen-containing gas react in a vapor phase, thereby producing the Group III nitride crystal.

2. The method according to claim 1, wherein the Group III metal is gallium.

3. The method according to claim 1, wherein the step of producing a Group III nitride crystal comprises steps of:
  causing the Group III metal to react with the oxidizing agent, thereby generating Group III metal oxidation product gas; and
  causing the Group III metal oxidation product gas to react with the nitrogen-containing gas, thereby generating the Group III nitride crystal.

4. The method according to claim 3, where in the step of generating Group III metal oxidation product gas, the Group III metal is caused to react with the oxidizing agent in a heated state.

5. The method according to claim 3, wherein the Group III metal oxidation product gas is Group III metal oxide gas.

6. The method according to claim 5, wherein the Group III metal is gallium and the Group III metal oxide gas is $Ga_2O$ gas.

7. The method according to claim 1, wherein the oxidizing agent is an oxygen-containing compound.

8. The method according to claim 1, wherein the oxidizing agent is oxidizing gas.

9. The method according to claim 8, wherein the oxidizing gas is at least one selected from the group consisting of $H_2O$ gas, $O_2$ gas, $CO_2$ gas, and CO gas.

10. The method according to claim 8, wherein the oxidizing gas is $H_2O$ gas.

11. The method according to claim 1, wherein the nitrogen-containing gas is at least one selected from the group consisting of $N_2$, $NH_3$, hydrazine gas, and alkylamine gas.

12. The method according to claim 8, wherein the oxidizing gas has a volume in a range from 0.001% to 60% with respect to a total volume of the oxidizing gas and the nitrogen-containing gas.

13. The method according to claim 1, where in the step of producing a Group III nitride crystal, a reaction is performed in the presence of reducing gas in a reaction system.

14. The method according to claim 13, wherein the reducing gas is hydrogen-containing gas.

15. The method according to claim 13, wherein the reducing gas is at least one selected from the group consisting of $H_2$ gas, carbon monoxide (CO) gas, hydrocarbon gas, $H_2S$ gas, $SO_2$ gas, and $NH_3$ gas.

16. The method according to claim 15, wherein the hydrocarbon gas is at least one of methane gas and ethane gas.

17. The method according to claim 13, wherein the oxidizing agent is the oxidizing gas according to any one of claims 8 to 10, and the oxidizing gas is mixed with the reducing gas.

18. The method according to claim 13, wherein the nitrogen-containing gas is mixed with the reducing gas.

19. The method according to claim 13, wherein a reaction in the presence of the reducing gas is performed at a temperature of 650° C. or higher.

20. The method according to claim 1, wherein the Group III nitride crystal is generated on a substrate.

21. The method according to claim 20, wherein the substrate comprises an underlayer and a seed crystal disposed on the underlayer.

22. The method according to claim 1, wherein the Group III nitride crystal is generated in a condition under pressure.

23. The method according to claim 1, where in the step of producing a Group III nitride crystal, the Group III nitride crystal has a growth rate of 100 μm/h or more.

24. The method according to claim 1, further comprising a step of:
slicing the Group III nitride crystal to provide at least one Group III nitride crystal substrate.

25. The method according to claim 24, further comprising a step of:
again producing a Group III nitride crystal with the Group III nitride crystal substrate obtained in the step of slicing as a seed crystal, where in the step of again producing a Group III nitride crystal, the Group III nitride crystal is generated on the Group III nitride crystal substrate.

26. The method according to claim 1, wherein the Group III nitride crystal has a dislocation density of $1\times10^7/cm^2$ or less.

27. The method according to claim 1, wherein the group III nitride crystal has a half width of each of a symmetric reflection component and an asymmetric reflection component by X-ray rocking curve method is 300 seconds or less.

28. The method according to claim 1, wherein the Group III nitride crystal is a semiconductor.

29. An apparatus for producing a Group III nitride crystal used in the method according to claim 1, the apparatus comprising:
a reaction vessel;
a Group III metal supply unit;
an oxidizing agent supply unit; and
a nitrogen-containing gas supply unit, wherein
the Group III metal supply unit is configured to continuously supply the Group III metal into the reaction vessel,
the oxidizing agent supply unit is configured to continuously supply the oxidizing agent into the reaction vessel,
the nitrogen-containing gas supply unit is configured to continuously supply the nitrogen-containing gas into the reaction vessel, and
the Group III metal is caused to react with the oxidizing agent and the nitrogen-containing gas in the reaction vessel in a vapor phase to produce the Group III nitride crystal.

* * * * *